United States Patent
Hollis

(10) Patent No.: US 9,324,454 B2
(45) Date of Patent: Apr. 26, 2016

(54) DATA PATTERN GENERATION FOR I/O TESTING OF MULTILEVEL INTERFACES

(71) Applicant: QUALCOMM Incorporated, San Diego, CA (US)

(72) Inventor: Timothy Mowry Hollis, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 14/144,432

(22) Filed: Dec. 30, 2013

(65) Prior Publication Data

US 2015/0187441 A1   Jul. 2, 2015

(51) Int. Cl.
| | |
|---|---|
| G01R 31/28 | (2006.01) |
| G11C 29/36 | (2006.01) |
| G11C 29/12 | (2006.01) |
| G06F 11/263 | (2006.01) |
| G06F 11/27 | (2006.01) |
| G11C 29/02 | (2006.01) |

(52) U.S. Cl.
CPC .............. *G11C 29/36* (2013.01); *G06F 11/263* (2013.01); *G06F 11/27* (2013.01); *G11C 29/022* (2013.01); *G11C 29/1201* (2013.01); *G11C 29/12005* (2013.01); *G11C 2029/1206* (2013.01); *G11C 2029/3602* (2013.01)

(58) Field of Classification Search
CPC .................. G06F 11/263; G06F 11/27; G11C 2029/3602; G11C 29/36; G11C 19/287; G11C 2029/0405
USPC ....................................................... 714/733
See application file for complete search history.

(56) References Cited

U.S. PATENT DOCUMENTS

| | | | |
|---|---|---|---|
| 6,232,759 B1 | 5/2001 | Wohlfarth | |
| 6,873,939 B1 | 3/2005 | Zerbe et al. | |
| 7,275,187 B2 * | 9/2007 | Kawasaki | G11C 29/14 714/702 |
| 7,302,623 B2 | 11/2007 | Kang et al. | |
| 9,122,570 B2 * | 9/2015 | Hollis | G06F 13/00 |
| 2002/0136066 A1 * | 9/2002 | Huang | G11C 29/24 365/200 |
| 2006/0005095 A1 | 1/2006 | Ichikawa | |
| 2006/0242483 A1 | 10/2006 | Werner et al. | |
| 2007/0089006 A1 | 4/2007 | Zimmerman | |
| 2009/0257547 A1 | 10/2009 | Tsai | |
| 2013/0019130 A1 * | 1/2013 | Hakhumyan | G11C 29/10 714/718 |
| 2013/0173989 A1 | 7/2013 | Chung et al. | |
| 2015/0067197 A1 * | 3/2015 | Hollis | G06F 12/00 710/16 |

OTHER PUBLICATIONS

Allen J., et al., "PAM-N Bit Error Rate Testing and Signal Analysis," Picosecond Pulse Lab, Application Note AN-28, Revision 1, Aug. 2013, 5 pages.

(Continued)

*Primary Examiner* — David Ton
(74) *Attorney, Agent, or Firm* — Loza & Loza, LLP

(57) ABSTRACT

One feature is a method of reading data from a plurality of pattern registers, generating a first output at a mapping register from the read data, generating a second output, different from the first output, at the mapping register from the read data, and generating a multi-level signal using the first and second outputs. In one embodiment, generating the first output is done by adding a first plurality of bits to a second plurality of bits, and generating the second output is done by adding the first plurality of bits to an inverse of the second plurality of bits.

30 Claims, 15 Drawing Sheets

(56) References Cited

OTHER PUBLICATIONS

Chrisanthopoulos A., et al., "New Test Pattern Generation Units for NPSF Oriented Memory Built-In Self Test," The 8th IEEE International Conference on Electronics, Circuits and Systems, 2001, pp. 749-752.

Wang S., et al., "DS-LFSR: A BIST TPG for Low Switching Activity," IEEE Transactions on Computer-Aided Design of Integrated Circuits and Systems, Jul. 2002, vol. 21 (7), pp. 842-851.
Partial International Search Report—PCT/US2014/072798—ISA/EPO—May 18, 2015.
International Search Report and Written Opinion—PCT/US2014/072798—ISA/EPO—Oct. 12, 2015.

* cited by examiner

DATA PATTERN GENERATION FOR I/O TESTING OF MULTILEVEL INTERFACES

BACKGROUND

1. Field

Various features relate to Data Pattern Generation for Input/Output (I/O) Testing, and in particular to Pattern Generation for (I/O) Testing for a memory device in which the memory is fully usable during the I/O testing of multilevel interfaces.

2. Background

As data-rates continue to rise, off-chip input/output (I/O) characterization becomes increasingly critical. In the field, and even in test environments, I/O characterization is facilitated through built-in self-test (BIST) methods and hardware.

A BIST may serve to test the functionality of a device, characterized the device, and/or ascertain whether problems exist in the device. Sometimes, a BIST may incorrectly indicate a functional failure. For instance, there could be errors in a memory mechanism of a device itself that shows up as errors in the output, corrupting any analysis of the output performance. Traditionally, during some BIST tests, a write operation to the memory may be performed and then the memory is read out and tested to make sure the read/write operations worked correctly. The read and write functions may be correct, but a particular memory cell (e.g., a memory cell under test/use), is bad. Some internal structure along the data path to the memory cell may be bad. For example, a particular BIST test may measure data speed and accuracy across a data line and the BIST test may indicate a failure of the data line when actually the failure may be due to a faulty memory cell.

Typical BISTs employ binary data lines that allow for only binary signals. This hinders testing of devices that employ multi-level signaling which may allow for signals having three states or more.

Therefore, a method and/or device are needed that facilitate multi-level data pattern generation to enable to run a built-in self-test for a device without necessarily activating all the internal workings of the device.

SUMMARY

Methods and apparatus are herein described for generating common and complex I/O characterization data patterns using limited circuitry. These methods and/or circuitry may enable, for example, generation of at least some of the following common types of patterns: pulse response measurements, pseudo-random bit sequences, in phase and out of phase crosstalk evaluation, and power distribution network (PDN) resonance excitation.

A method is provided for generating multi-level signals from data stored in one or more pattern registers. Data is read from one or more pattern registers. A first output is generated from a first mapping register using the read data. A second output, different from the first output, is generated from the first mapping register or a second mapping register using the read data. A multi-level signal is then generated using the first and second outputs. An input/output test operation may be performed using the first and second outputs (e.g., using the multi-level signal). The input/output (I/O) test operation may serve to at least partially characterize the performance of output drivers using the multi-level signals.

Reading data from one or more pattern registers may include: (a) reading a first plurality of bits from a first pattern register, and (b) reading a second plurality of bits from a second pattern register. Generating the first and second outputs may include: (a) generating the first output by adding the first plurality of bits to the second plurality of bits, and (b) generating the second output by adding the first plurality of bits to an inverse of the second plurality of bits.

In one example, the first output may be generated using a first pattern register and the first mapping register, and the second output may be generated using the first pattern register and the second mapping register. In another example, the first output may be generated using a first pattern register and the first mapping register, and the second output may be generated using a second pattern register and the first mapping register.

In one implementation, the one or more pattern registers may be within a memory circuit, and the plurality of data patterns is stored a plurality of registers coupled proximate to output drivers for the memory circuit. The multi-level signal is inserted into data lines extending between a memory cell array and the plurality of output drivers for the memory circuit.

In another example, reading data from one or more pattern registers may include: (a) reading a first plurality of bits from a first pattern register, and (b) reading a second plurality of bits from a second pattern register.

In one example, generating the first output and second output may include: (a) generating the first output by adding the first plurality of bits to the second plurality of bits, (b) shifting the second plurality of bits at least one place with a linear-feedback-shift-register to create a modified second plurality of bits, and/or (c) generating the second output by adding the first plurality of bits to the modified second plurality of bits. The first pattern register may be a read-only register and the first plurality of bits are pre-stored in the first pattern register.

In some implementations, the multi-level signal may define at least three current or voltage levels or states. In one example, generating a multi-level signal using the first and second outputs comprises generating the multi-level signal using the first and second outputs using pulse-amplitude modulation, such the generated multi-level signal defines: (a) a zero level when no output is received, (b) a first level when only the first output is received, (c) second level when only the second output is received; and/or (d) a third level when both the first and the second outputs are received. The zero level, the first level, the second level, and the third level may all be of different voltage or current levels.

According to another aspect, a device is provided comprising: (a) a memory cell array, (b) a plurality of output drivers coupled to the memory cell array via a plurality of data lines, and/or (c) a built-in self-test circuit operationally coupled to the plurality of data lines. The built-in self-test circuit may be configured to: (a) read data from one or more pattern registers, (b) generate a first output from a first mapping register using the read data, (c) generate a second output, different from the first output, from the first mapping register or a second mapping register using the read data, and/or (d) generate a multi-level signal using the first and second outputs. The device may be configured to perform one or more of the functions of the method described above.

Features described herein include a method which includes reading a most significant bit or byte (MSB) of a value from one pattern register and reading a least significant bit or byte (LSB) of that value from another pattern register. A first value is generated by adding the MSB to the LSB, and generating a second value by adding the MSB to the complement of the LSB. Alternatively, a first value is generated by adding the MSB to the LSB, and generating a second value by adding the LSB to the complement of the MSB. The two different outputs can be used in at least one built-in-self-test.

DETAILED DESCRIPTION

Figure 1:
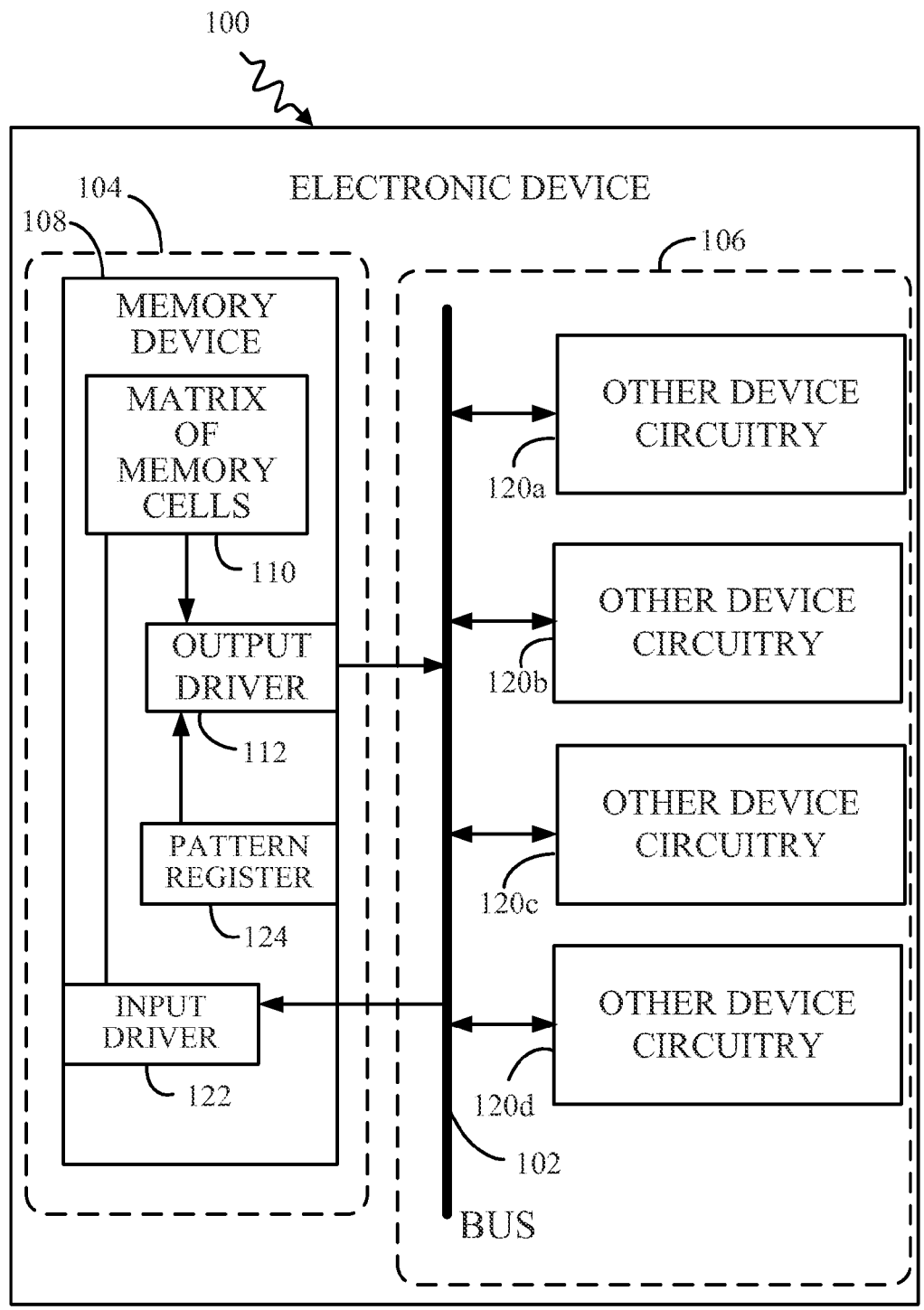
FIG. 1 illustrates an exemplary electronic device that includes a memory device or circuit.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures, and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation.

Overview

Methods and apparatuses are described herein that implement data pattern generation for multi-level I/O testing. A method of reading data from a plurality of pattern registers is described herein, wherein the method includes generating a first output at a mapping register from the read data, generating a second output, different from the first output, at the mapping register from the read data, and generating a multi-level signal using the first and second outputs. In one example, generating the first output is done by adding a first plurality of bits to a second plurality of bits, and generating the second output is done by adding the first plurality of bits to an inverse of the second plurality of bits. In one aspect, provided herein is a method of reading data from a plurality of pattern registers, and generating two different outputs at a mapping register from the read data. For example, a first plurality of bits is read from one pattern register and a second plurality of bits is read from another pattern register. A first output is generated by adding the first plurality of bits to the second plurality of bits, and a second output is generated by adding the first plurality of bits to an inverse of the second plurality of bits. A multi-level signal using the two outputs is generated, and, in one aspect, the multi-level signal uses pulse-amplitude modulation. The output values may be used in a multi-level BIST. Either or both of the pluralities of bits may be shifted one or more places using a shift-register.

Features described herein include a method that includes reading a most significant bit or byte (MSB) of a value from one pattern register and reading a least significant bit or byte (LSB) of that value from another pattern register. A first value is generated by adding the MSB to the LSB, and generating a second value by adding the MSB to the complement of the LSB. Alternatively, a first value is generated by adding the MSB to the LSB, and generating a second value by adding the LSB to the complement of the MSB. The two different outputs can be used in at least one built-in-self-test.

Exemplary Data Pattern Generation for Multi-level I/O Testing and Methods for Implementing the Same Heretofore, the characterization(s) of I/O properties of electrical devices coupled to a memory were limited by the speed of the memory itself. In other words, one or more data patterns would be stored in a memory and then retrieved for use in the testing or characterization of devices coupled to the output driver of the memory. However, the data pattern retrieval from the memory was the bottleneck in the I/O testing. Alternatively, the one or more data patterns capable of being used in BISTs were stored remote from the memory array and across the main bus and on the controller side of the main bus. That also caused a delay and potential I/O-related errors in data pattern retrieval. Therefore described herein are structure(s) (i.e., apparatus) and methods wherein pattern registers are positioned on the memory side of the bus and physically proximate to at least one output driver of the memory array.

FIG. 1 illustrates an exemplary electronic device that includes a memory device or circuit. In various examples, the electronic device 100 may be a mobile phone, smartphone, tablet, portable computer, and/or any other electronic device having circuitry. The device 100 includes a main bus, a system bus, or bus 102 separating or defining a memory side 104 of the device 100 and a non-memory side 106 (i.e., a bus side of device 100) of the device 100. The device 100 includes a memory device 108 including a matrix of memory cells 110, which in one embodiment is dynamic random-access memory (DRAM) memory, and an associated output driver 112. The output driver 112 is coupled to the system bus 102 to which other device circuits 120a, 120b, 120c, and 120d may also be coupled. An input driver 122 is also coupled to the bus 102 and to the matrix of memory cells 100. Typical other device circuitry 120a and 120b includes a camera, a speaker, a microphone, and/or a display object, etc. Notably, a data pattern register 124 is positioned on the memory side 104 of the device, as opposed to being on the bus side 106. The proximity of the data pattern register 124 to the output driver 112 enables a relatively fast initialization of any desired BIST multi-level I/O testing (e.g., tri-level signaling, quad-level signaling, etc.) by speeding up the amount of time consumed in providing the output driver 112 with a pair of data patterns as described herein. In other words, what has been known is to provide the output driver 112 with a data pattern from either the bus side 106 of the device or from the memory cells 110 themselves. However, each of these implementations cause delays and unrelated errors, which are eliminated by sending one or more data patterns to the output driver 112 from the memory side 104, but without using any of the memory cells of the matrix or memory array 110. Therefore, no reading of the memory array 110 is necessary, resulting in a much quicker initiation of the multi-level I/O testing.

Figure 2:
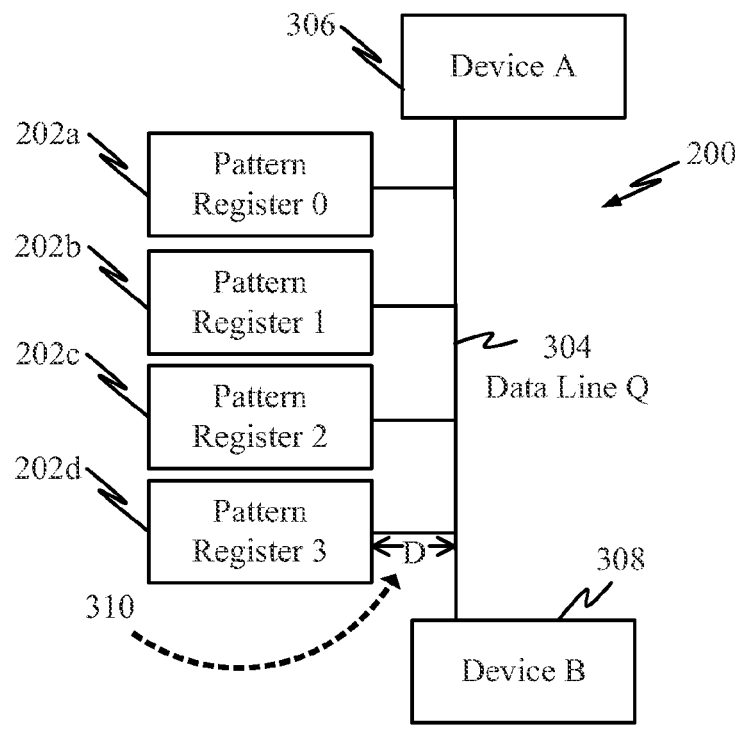
FIG. 2 illustrates a block diagram of a register data line circuit including a plurality of pattern registers connected to a data line between a first device and a second device.

FIG. 2 illustrates a block diagram of a register data line circuit 200 including a plurality of pattern registers 202a, 202b, 202c, and 202d coupled to a data line 204 (Data line Q) between a first device 206 and a second device 208. In one embodiment, the data line 204 is an output or read data line. A distance 210 (i.e., "D" in FIG. 2) exists between pattern registers 202 and the read data line 204. In one example, the first device 206 may be memory cell array while the second device 208 may be output driver for a memory circuit. In various exemplary implementations, the distance D 210 may between 10 millimeters and 50 mm, between 1 mm and 10 mm, less than 10 mm, less 5 mm, less than 1 mm, less than 300 nm, less than 200 nm, and/or less than 100 nm. Ideally with a via size defined as two lambda, the distance is between two to four lambda. In other words, no matter what the process size for the manufacturing of an integrated circuit (IC) is (e.g., 20 nm or 65 nm process size), the smallest sized elements on the chip are typically vias and they are deemed to be two lambda by two lambda square. And therefore, any element distanced from between two and four lambda away from another element on the chip is very close to the other element. It is desirable that the pattern registers 202 be relatively close to the output/read data line 204 (e.g., within the same semiconductor die, within the same chip, within the same memory module, etc.). Alternatively, the distance between a pattern register 202 and the data line 204 may be twenty lambdas or less.

When the first device 206 is a memory cell array, accessing any of the pattern registers 202a, 202b, 202c, and 202d does not affect access to any of the memory cells of the first device 206. In other words, a device accessing the memory cell array of the first device 206 may have full access to the entire memory cell array while the pattern register is being read. Therefore, a controller (e.g., a processing circuit) controlling the first device 206 and all the pattern registers 202 and the second device 208 can access a data pattern from one or more pattern registers 202 and send it to an output driver (e.g., second device 208) to test the output driver, and/or any peripheral devices connected to the memory cell array (e.g., first device 206). In one example, the pattern register reading and associated I/O testing (i.e., characterization) is performed without using any of the memory in the memory cell array (e.g., in the first device 206).

Also in some examples, a mapping register is located between the pattern register 202 and the data line 204, and the distances recited herein may be between the pattern register 202 and the mapping register and also the distance between the mapping register and the data line 204. Therefore, in those cases the distance between the pattern register 202 and the read data line 204 may be twice the dimensions recited herein. In one embodiment, the circuit 200 facilitates trying to characterize the maximum performance of a device (e.g., memory device or circuit) during a built-in-self-test (BIST). Traditionally, during some BISTs, a write to the memory is performed and then the memory is read out and tested to make sure the read/write operations worked correctly. However, there could be errors in the memory mechanism itself that show up as errors in the output corrupting any analysis of the output performance. In other words, the read and write functions are correct, but a particular memory cell or element in the data path is bad. Put differently, some internal structure to the memory cell is bad. Herein described are methods and apparatus that provide data pattern generation flexibility in a way to enable a user to run a memory device or some other device (e.g., a data acquisition device) BIST without activating all the internal workings of the device in case some of the internal workings are faulty.

Figure 3:
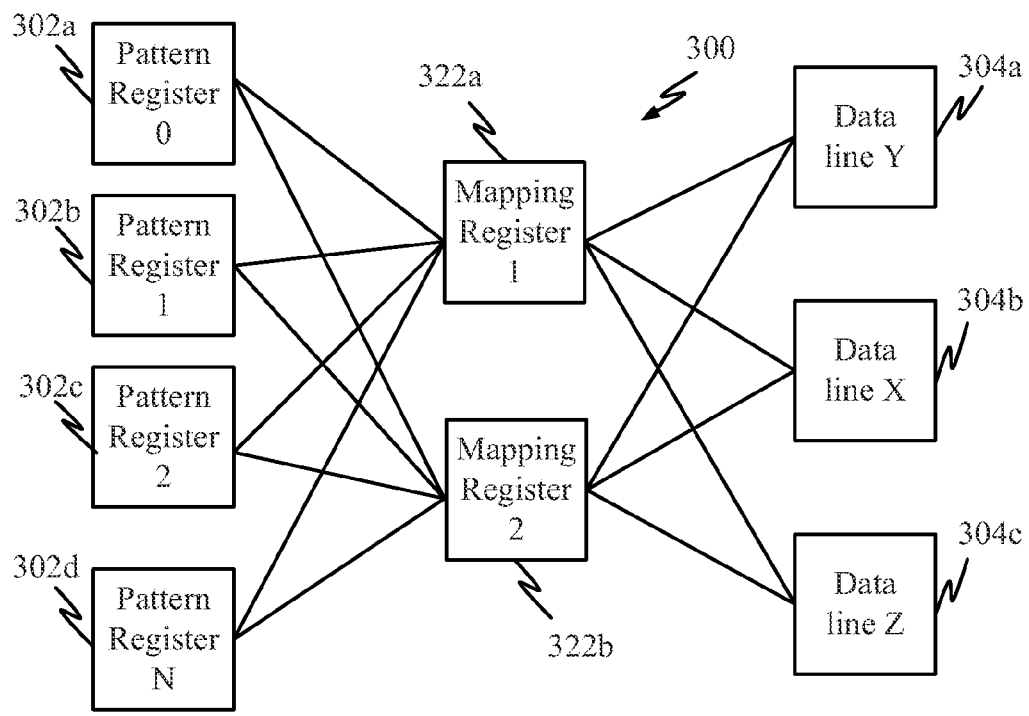
FIG. 3 illustrates a block diagram of a register data line circuit wherein a plurality of pattern registers are connected to a plurality of exemplary data lines via a plurality of mapping registers.

Toward that end, FIG. 2 illustrates a series of pattern registers 202a, 202b, 202c, and 202d located proximate the output/read data line path 204. The multi-bit pattern registers 202a, 202b, 202c, and 202d may each store a single data pattern. The pattern registers 202a, 202b, 202c, and 202d can be write-able or read-only with hard coded values. As illustrated in FIG. 3 a multi-bit mapping register 322a stores values used to map true or complement versions of data held in a plurality of pattern registers 302a, 302b, 302c, and 302d to one or more of a plurality of DQ-specific output/read data line paths 304a, 304b, and 304c. A plurality of mapping registers 322a and 322b may be utilized to map specific pattern sequences to different data channels. Although illustrated in FIG. 3 as four pattern registers 302a, 302b, 302c, and 302d, two mapping registers 322a and b, and three data lines 304a and 304b, there may be any number of pattern registers, mapping registers, and/or data lines. The specific pattern sequences may be utilized in performing one or more BISTs useful for characterization of circuit elements such as devices coupled to an I/O input or output driver. More specifically, specific pattern sequences can be used to make pulse response measurements, as pseudo-random bit sequences, to do in phase and out of phase crosstalk evaluation, and for power distribution network (PDN) resonance excitation. For example, crosstalk can be evaluated in terms of in and out of phase aggressors versus victims.

Additionally, the BIST patterns can be used to train. In other words, the circuits described herein are part of a much larger device such a memory device or some other device (e.g., a cell phone, or a data acquisition device, such as a camera), and the BIST returns an evaluation (e.g., a crosstalk evaluation) that can be used by the larger device to improve operations therein. The BIST may be altered in cases where training took place. For example, an initial BIST could be generally mild, but after training and reconfiguring based upon the training, another BIST may be more robust than the initial BIST was. Accordingly, this is self-adaptive and/or self-correcting and/or self-healing. The more robust BIST may have higher expectations than the initial BIST because of improvements achieved by the training, and can trigger an error flag, or return to being the initial BIST and trigger a retraining possibly because of detrimental process drift occurring after the initial training. The BIST may be part of a power-on-self-test (POST) BIST, as opposed to a POST which is not built-in but initiated by or assisted by another device. In a multi-device environment, this BIST can be part of a larger BIST engine. In addition, the device that contains the circuits illustrated and described herein may not be in control of the data bus that the device is connected to (or on an interface with), the device can be a slave device or a master device.

FIG. 3 illustrates a block diagram of a register data line circuit 300 wherein a plurality of pattern registers 302a, 302b, 302c, and 302d are connected to a plurality of exemplary data lines 304a, 304b, and 304c. The pattern registers 302a, 302b, 302c, and 302d may be flip flop or latch registers and can be one bit, one byte, or any desired size. As illustrated in FIG. 3, when each pattern register 302a, 302b, 302c, and 302d is single bit, $2^4$ different values can be sent to the output/read data lines 304a, 304b, and 304c. With traditional binary signaling, each data line may only be sent two values (logical 0 and 1) when the pattern registers are single bit. However, in FIG. 3, at least two multi-bit pattern registers 302 (e.g., Pattern Register N and Pattern Register 0) may store a Most Significant Bit (MSB) and a Least Significant Bit (LSB) of a multi-level data pattern, respectively. The pattern registers 302a, 302b, 302c, and 302d can be write-able or read-only with hard coded values. One or more multi-bit mapping registers 322a and 322b stores values used to map the data held in the pattern registers 302a, 302b, 302c, and 302d to one or more of the DQ-specific read data line paths 304a, 304b, and 304c. The plurality of mapping registers 322a and 322b may be utilized to map specific pattern sequences to different data channels. The specific pattern sequences can be used to do the BIST or other tests. More specifically, specific pattern sequences can be used to make pulse response measurements, as pseudo-random bit sequences, and to do in phase and out of phase crosstalk evaluation.

As described below in more detail having at least one mapping register increases the variability of the data supplied to the data lines 304a, 304b, and 304c by sending true copies of patterns within each pattern register 302a, 302b, 302c, and 302d as well as complementary copies (i.e., the logical complement or inverse) of the patterns in the pattern registers 302a, 302b, 302c, and 302d. For example, a pattern generator block diagram 300 may use only two pattern registers 302a and 302b which hold data called DATA1 (e.g., in a first register 302a) and hold data called DATA2 (e.g., in a second register 302b). One or more of the mapping registers 322a and 322b can send to the data line a zero or nothing (first value), or can combine DATA1 and DATA2 and send that combined value (second value), or can combine the DATA 1's complement ($\overline{DATA1}$) with DATA2 (third value), or can combine the DATA2's complement ($\overline{DATA2}$) with DATA1 (fourth value), and lastly, can combine both DATA1's and DATA2's complement (fifth value). Each mapping register 322 may include an interface that couples to the pattern registers 302a and 302b and to one or more of the data lines 304a, 304b, 304c, and 304d. The interface enables the mapping register to read the pattern registers and to write to the data lines. The interface can be internal or external to the mapping register 322. In one feature, the mapping register interface can write to the pattern registers 302a and 302b. Alternatively, other devices can write to the pattern registers or the pattern registers can be implemented as fixed and read-only.

In one exemplary embodiment, only one pattern register (e.g., a "PRX") 302a is available with a plurality of mapping registers 322a and 322b. The PRX holds one bit or byte and the two mapping registers can alter the data before mapping the data. For example, using an eight bit pattern register (e.g., 302a) the data stored can be sent to any of the data lines 304a, 304b, 304c as a true copy by mapping register 1 (e.g., register 322a) and the complement of the data in the PRX can be sent by mapping register 2 (e.g., register 322b) to one or more of the data lines 304a, 304b, and 304c. Any and all of the various outputs described herein can be used in built-in-self-tests.

The patterns generated in this manner may be used, for example, for testing and/or training of a device. For instance, the circuits described herein may be part of a much larger device such a memory device or some other device (e.g., a cell phone, or a data acquisition device, such as a camera), and the BIST returns an evaluation (e.g., a crosstalk evaluation) that can be used by the larger device to improve operations therein. The BIST may be altered in cases where training took place. For example, an initial BIST could be generally mild, but after training and reconfiguring based upon the training, another BIST may be more robust than the initial BIST was. Accordingly, this is self-adaptive and/or self-correcting and/or self-healing. The more robust BIST may have higher expectations than the initial BIST because of improvements achieved by the training, and can trigger an error flag, or return to being the initial BIST and trigger a retraining possibly because of detrimental process drift occurring after the initial training. The BIST may be part of a power-on-self-test (POST) BIST, as opposed to a POST, which is not built-in but initiated by or assisted by another device. In a multi-device environment, this BIST can be part of a larger BIST engine. In addition, the device that contains the circuits illustrated and described herein may not be in control of the data bus that the device is connected to (or on an interface with), the device can be a slave device or a master device.

Figure 4:
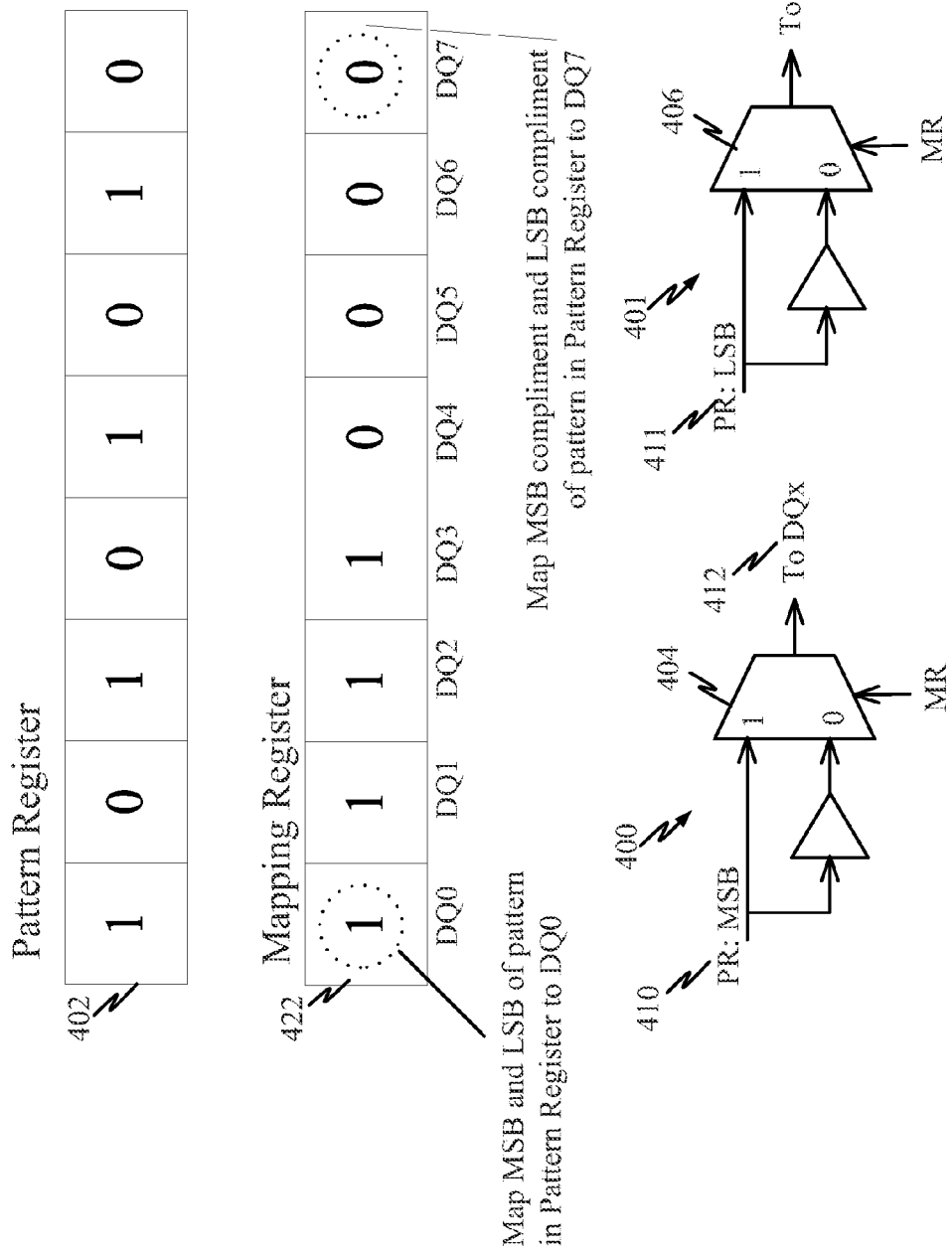
FIG. 4 illustrates a block diagram of a circuit including two 8-bit registers, one 8-bit pattern register and one 8-bit mapping register for a total of 16 bits.

FIG. 4 illustrates a block diagram of a multi-bit mapping register 422 that stores values used to map the most significant bit (MSB)/least significant (LSB) pairs of the data held in a plurality of pattern registers 402 to one or more of the DQ-specific read data paths 304a, 304b, 304c (e.g., one or more of the Data line Y, Data line X, and/or Data line Z shown in FIG. 3). One or more mapping registers (MR) 422 may be utilized to map specific pattern sequences to different data lines 304a, 304b, 304c. In one example, each individual bit register in the mapping register 422 directs the bits from the pattern registers to specific output drivers or data lines 304a, 304b, 304c coupled to such output drivers. For instance, each individual bit register of the mapping register may be configured to output to a particular data line (e.g., DQ0, DQ1, . . . , DQ7) or corresponding output driver. According to one example, a first circuit 400 includes a first multiplexer or switch 404 having a first input ("0") coupled to an inverted version of the pattern register (PR) 410 and a second input ("1") coupled to the pattern register (PR) 410. Similarly, a second circuit 401 may include a second multiplexer or switch 406 having a first input ("0") coupled to an inverted version of the pattern register (PR) 411 and a second input ("1") coupled to the pattern register (PR) 411. In this example, the first circuit 400 may be used to generate outputs for an MSB output and the second circuit 401 may be used to generate outputs for an LSB output.

Figure 6:
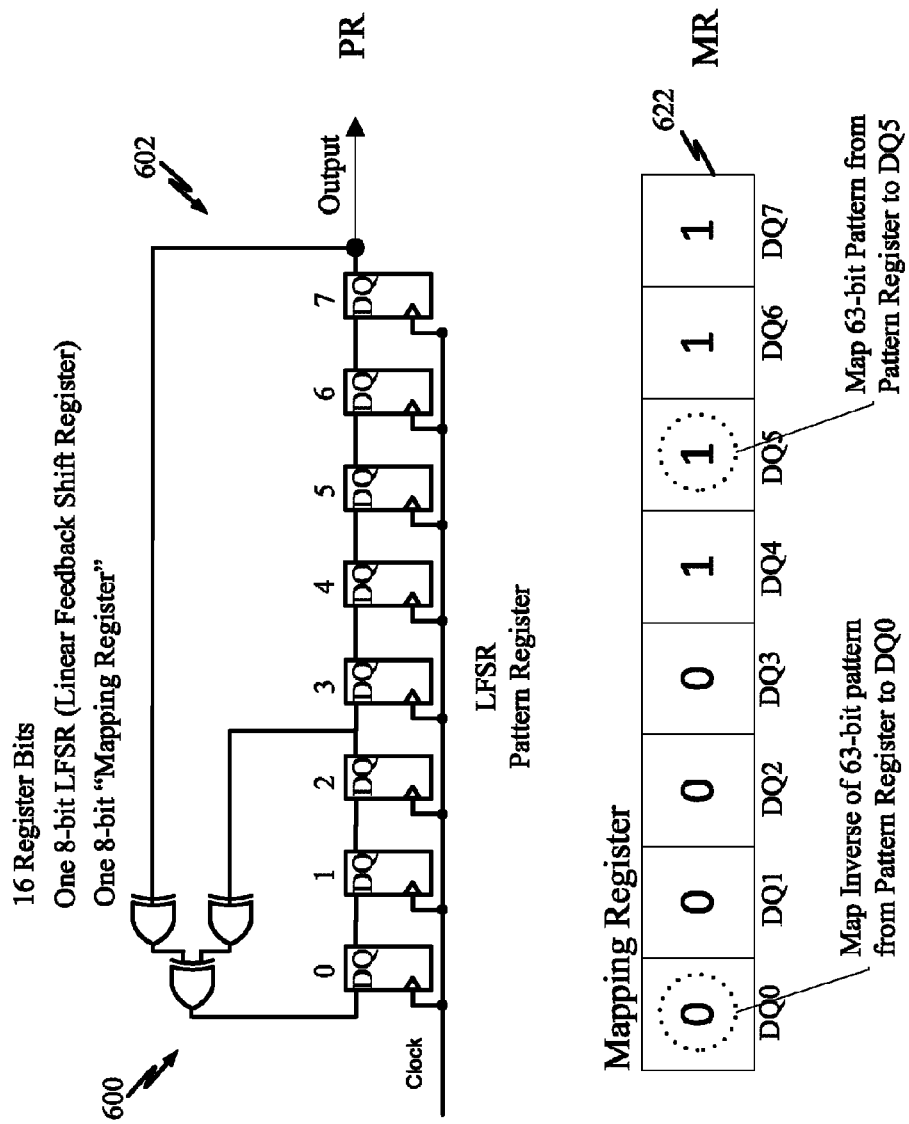
FIG. 6 illustrates a block diagram of a circuit including a linear-feedback-shift-register pattern register (LFSR) coupled to a mapping register.

The specific pattern sequences may be used to do a built-in-self-test (BIST). For example, the specific pattern sequences may be used to make pulse response measurements, as pseudo-random bit sequences, to do in-phase and out-of-phase crosstalk evaluation, and/or for power distribution network (PDN) resonance excitation. Furthermore, while illustrated with a $2^8$ word size, other word sizes are available. For example, $2^{16}$, or $2^{256}$, or even $2^{1024}$ word sizes are all possible. A Pulse-Amplitude Modulation (PAM) circuit 1200 (shown in FIG. 12) may be used to transmit the sum of the MSB and LSB represented as current levels. The methods and apparatus herein described combines logic gates and/or logic levels with multiplexing to create a wider variety of output combinations than is available for binary systems. In addition, the pattern registers can be transformed into linear-feedback-shift-registers (LFSRs as illustrated in FIG. 6) to enable pseudo random data pattern generation and transmission signals. The pseudo random data patterns can be used in built-in-self-tests. A first circuit 400 may be used to map bits from the pattern register 402 to some of the map one or more data lines. A second circuit 401, e.g., using a complement/inverse pattern, may serve to map to one or more other data lines (e.g., DQ7, etc.). As illustrated, the "mapping" first and second circuits 400 and 401 (e.g., multiplexers or switches) may select between two inputs (e.g., pattern register bits or complement/inverse pattern register bits) as indicated by the value of each mapping register (MR).

Figure 5:
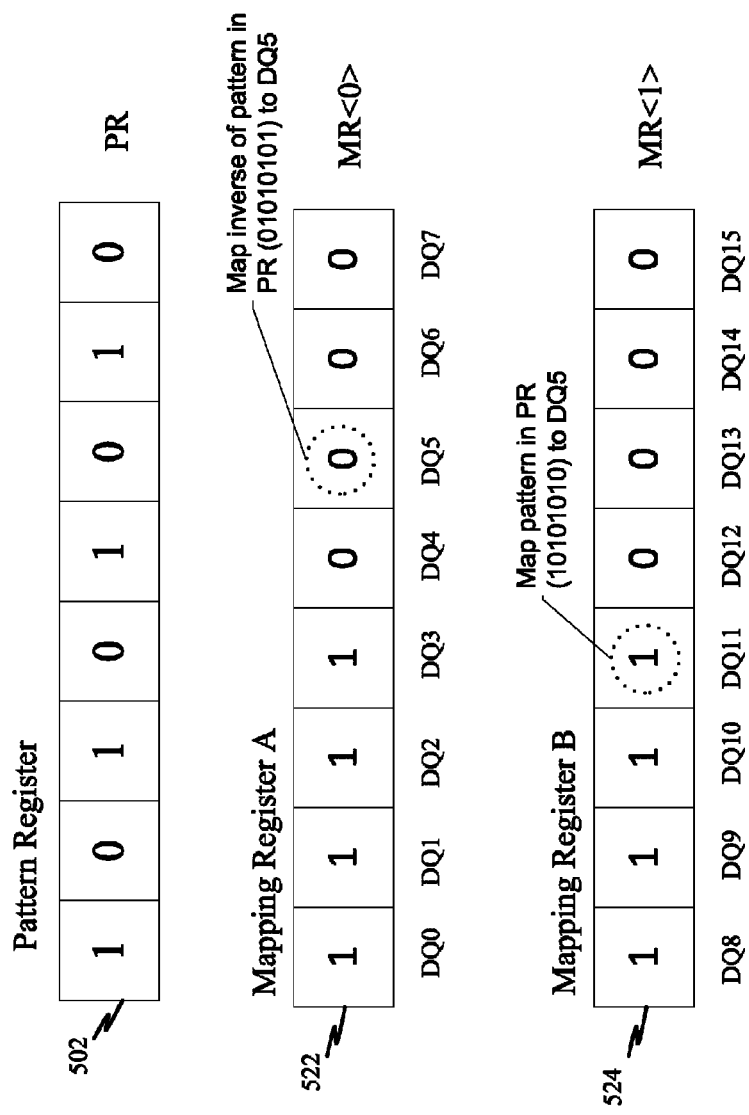
FIG. 5 illustrates three 8-bit registers, one 8-bit pattern register and two 8-bit mapping registers for a total of 24 bits.

FIG. 5 illustrates a block diagram a 24-bit extension of FIG. 4. More specifically, FIG. 5 conceptually illustrates three 8-bit registers (e.g., one 8-bit pattern register 502, and two 8-bit mapping registers A 522 and B 524) for a total of 24 bits. Each individual bit register of the 8-bit mapping registers A 522 and B 524 may correspond to a data line (DQx) or output driver. The contents of each individual bit register of mapping registers (MR) A 522 and B 524 may determine if a true copy of the pattern register 502 is sent to the respective data line or if a complement/inverse copy is being sent. In the illustrated example, a zero (0) bit in an individual bit register of a mapping register may indicate the complement (of the pattern register) is sent while a one (1) bit may indicate a true copy (of the pattern register) is sent. Note that those roles can be reversed. In one example, the individual bit registers of the pattern register 502 may be mapped according to the individual bit registers of the first mapping register A 522 to data lines DQ0-DQ3 and DQ8-DQ11 while the complement/inverse of the individual bit registers of the pattern register 502 may be mapped according to the individual bit registers of the second mapping B 524 to data lines DQ4-DQ7 and DQ12-DQ15. Moreover, as described below with respect to multi-level signaling, only the MSB and/or the LSB may be sent to a data line instead of the entire data word. For example, the first mapping register A 522 in combination with the pattern register 502 may serve to generate MSB outputs (e.g., mapped to MSB data lines DQ0-DQ3 and DQ8-DQ11). Similarly, the second mapping register B 524 in combination with the pattern register 502 may serve to generate LSB outputs (e.g., mapped to LSB data lines DQ4-DQ7 and DQ12-DQ15).

FIG. 6 conceptually illustrates a circuit 600 including a linear-feedback shift-register pattern register (LFSR) 602 coupled to the mapping register 622. The LFSR 602 is a shift register whose input bit is a linear function of its previous state. The LFSR 602 may send random data to all of the data lines (e.g., DQs), the LSFR 602 may send shifted data, so each bit is shifted one place. For example, the LSFR 602 sends data to the first data line DQ0, the LSFR 602 shifts the data one place and sends the single shifted data to the second data line DQ1 and so forth for all eight lines when the pattern register is an 8-bit LSFR pattern register. The LFSR 8 bit register 602, may have $2^8$ combinations of patterns, so 63 bit patterns are available although the pattern register is only 8 bits in size.

Moreover, in addition to the LSFR shifting the date, the LSFR may be "seeded" differently (i.e., re-seeded either self re-seeded or by another device or element (physical or logical)). The different logic connectivity between the shift register stages may produce distinct, yet still pseudo-random data streams. Upon reading an end bit of the LFSR multi-bit register, a wraparound may be done to start a next read at the other end of the register. The mapping register 622 again uses a one (1) for mapping a true copy of the pattern register's content and a zero (0) for mapping an inverse copy (complement) of the pattern register's content. In addition, other embodiments use other sizes of LFSR 602, such as a 4 bit register that uses LFSR to have $2^4$ patterns. The output values are used in built-in-self-tests.

Figure 7:
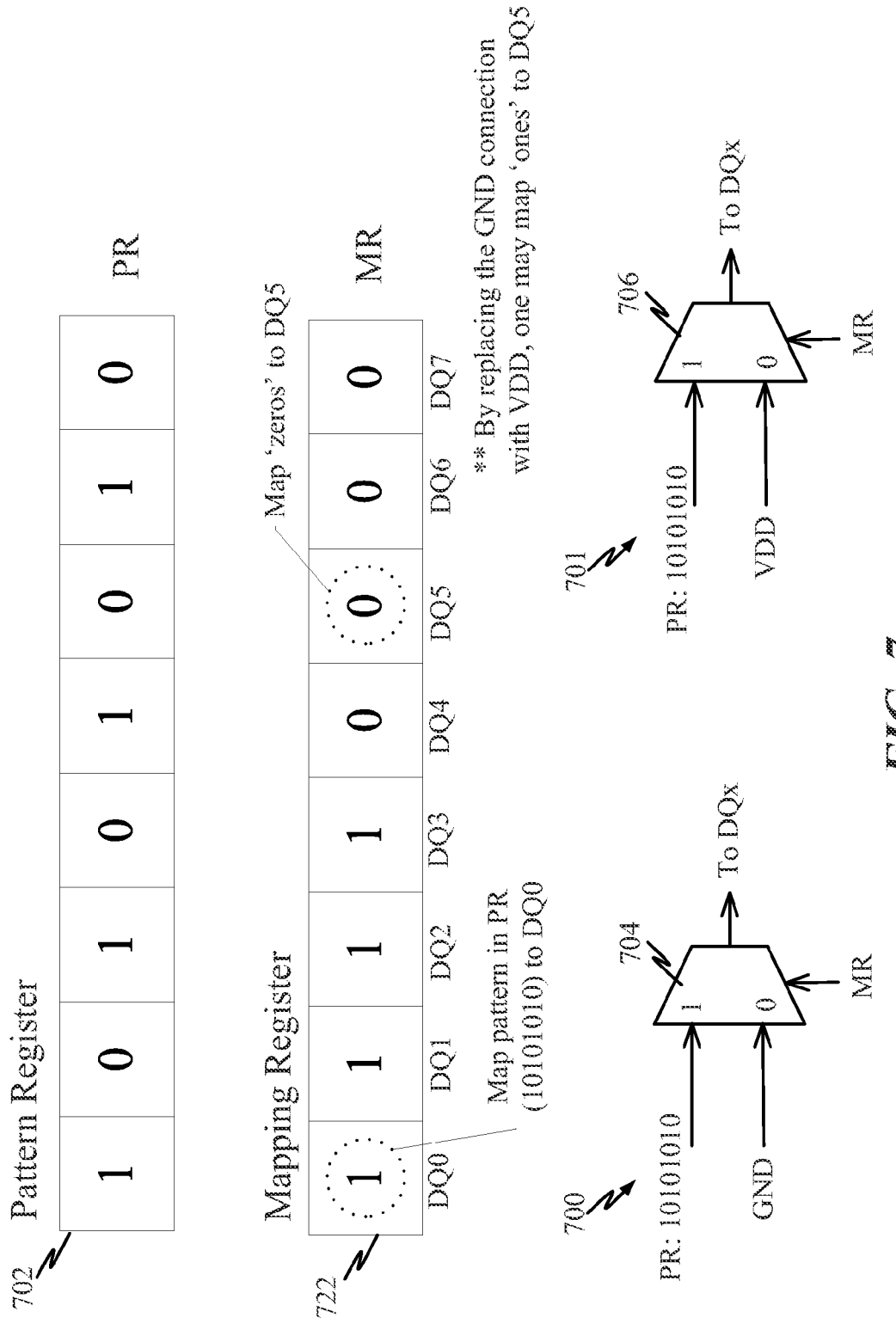
FIG. 7 illustrates a block diagram of a circuit including two 8-bit registers, one 8-bit pattern register and one 8-bit mapping register for a total of 16 bits.

FIG. 7 illustrates a block diagram a circuit 700 including two 8-bit registers (e.g., one 8-bit pattern register 702 and one 8-bit mapping register 722) for a total of 16 bits. Instead of using the true and inverse as illustrated in FIG. 4, FIG. 7 illustrates combining logic gates and logic levels with multiplexing to provide a wider variety of output combinations. For example, a first circuit 700 includes a first multiplexer or switch 704 have a first input ("0") coupled to ground (GND) or logical zero (0) and a second input ("1") coupled to the pattern register (PR). Similarly, a second circuit 701 may include a second multiplexer or switch 706 having a first input ("0") coupled to voltage source VDD or logical one (1) and a second input ("1") coupled to the pattern register (PR). In one example, the first and second circuits 700 and 701 may be the same circuit, with a switch prior to the first input ("0") to selectively couple first input ("0") to either GND (e.g., logical zero) or VDD (e.g., logical one). The use of a pattern register 702, mapping register 722, and mapping circuit 700 or 701 facilitates the ability to quickly write 8-bits to an 8-bit register, a zero copy (i.e., all zeroes), a true copy, an inverse copy, and all ones, and all permutations thereof. Put differently, a single data pattern (e.g., pattern register 702) can be utilized to create distinct pairs of data patterns.

As illustrated, the "mapping" circuits 700 and 701 may include multi-input multiplexers or switches 704 and 706, respectively. The mapping register (MR) may serve to select between two or more inputs (e.g., pattern register bits or inverse pattern register bits) as indicated by the value of each register of the mapping register (MR). For instance, if a first bit register of the mapping register is zero (0), then the first ("0") input line to the multiplexers or switches 704 and 706 may be selected. Similarly, if a second bit register of the mapping register 722 is one (1), then the second ("1") input line to the multiplexers or switches 704 and 706 may be selected. Each individual bit register may be configured to output to a particular data line (e.g., DQ0, DQ1, . . . DQ7) or corresponding output driver.

According to various possible examples, a true copy of the pattern and an inverse copy of the pattern make a first pair, all zeroes (a nothing copy) and a true copy make a second pair, all ones and a true copy make a third pair, a nothing copy and an inverse copy make a fourth pair, all ones and an inverse copy make a fifth pair, and lastly, all ones and a nothing copy form a sixth pair. All of these pairs can be used in BISTs. However, because the sixth pair does not utilize the single data pattern at all, there are only five pairs actually derived from the single data pattern. Although a nothing copy and an all ones copy are really not copies per se, rather they are versions or variations, however, these versions of the data with all ones or all zeroes are herewith termed copies for ease of understanding and readability. Alternatively viewed, a corrupted or changed copy is still a copy. Moreover, in the 8-bit example, all eight bits being zeroes or ones qualifies as a copy (e.g., as being a changed or altered copy). Put differently, multiplexing can be used to output something other than the "true" and "complements" of the pattern. Additionally, logic gates (not shown) may also be added to further manipulate the output pattern.

Figure 8:
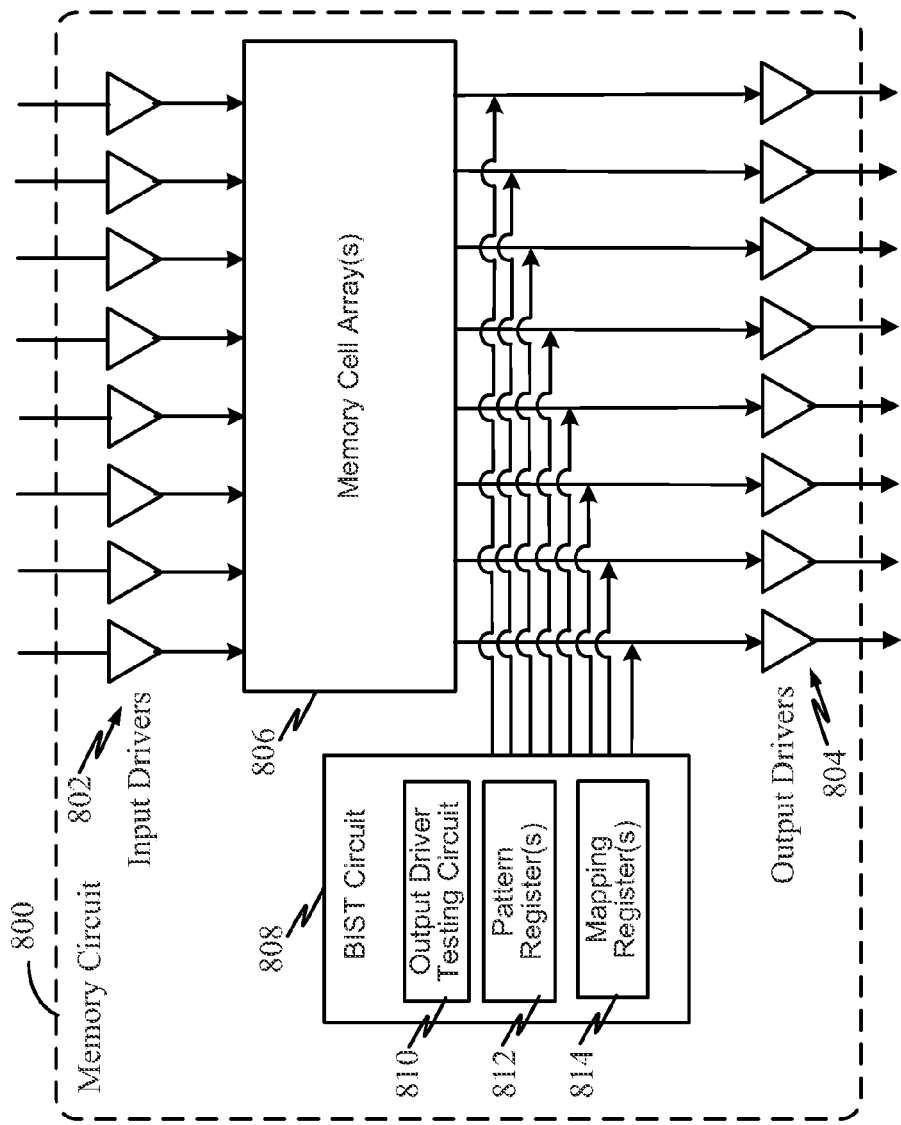
FIG. 8 illustrates a block diagram of a memory circuit including a built-in self-test (BIST) circuit that uses a pattern register and mapping registers to test a plurality of output drivers.

FIG. 8 illustrates a block diagram of a memory circuit including a built-in self-test (BIST) circuit that uses a pattern register and mapping registers to test a plurality of output drivers. The memory circuit 800 may include a plurality of input drivers 802 coupled to a plurality of memory cell arrays 806, and a plurality of output drivers 804 coupled to the plurality of memory cell arrays 806. In one example, the output drivers 804 may generate or output multi-level signals having more levels than a binary signal (e.g., more than two states or levels). For instance, such multi-level signal may be a tri-level or tri-state signal, quad-level or quad-state signal, or n-level or n-state signal (where n>2). A BIST circuit 808 includes an output driver testing circuit 810, one or more pattern registers 812, and one or more mapping registers 814. The BIST circuit 808 is coupled to the output drivers 812. The input drivers 802 and output drivers 812 may be coupled to a bus through which data is written into and read from the memory cell arrays 806. The memory circuit 800 may be integrated into such devices as a cellular phone, a display circuit, a camera device, an audio device, and/or a transmitter/receiver device.

The output driver testing circuit 810 may obtain/read a first pattern (e.g., of fixed length binary pattern) from the pattern registers 812 and may send the first pattern to one or more mapping registers 814 that then map one or more patterns to the output drivers 804. The mapping registers 814 may send a true copy of the first pattern from the pattern register 812, an inverse copy of the first pattern read from a pattern register 812, or altered copy such as a bit shifted of the pattern read from the pattern register 812. The circuitry and/or logic (e.g., within the BIST circuit 808 and/or output driver testing circuit 810) may then use the patterns provided by the mapping register(s) 814 to test (i.e., characterize) the output drivers 804 and/or devices coupled to the output drivers 804. Additionally, the BIST circuit in at least one embodiment is able to alter at least one parameter involving the memory cell arrays 806 and/or output drivers 804 in response to the results of the characterization of an I/O component (e.g., the output drivers 804 and/or any device coupled to an output driver 804). In various implementations, the BIST circuit 808, the pattern register 812 and mapping register(s) 814 may implement one or more of the features illustrated in FIGS. 2, 3, 4, 5, 6, and/or 7.

Figure 9:
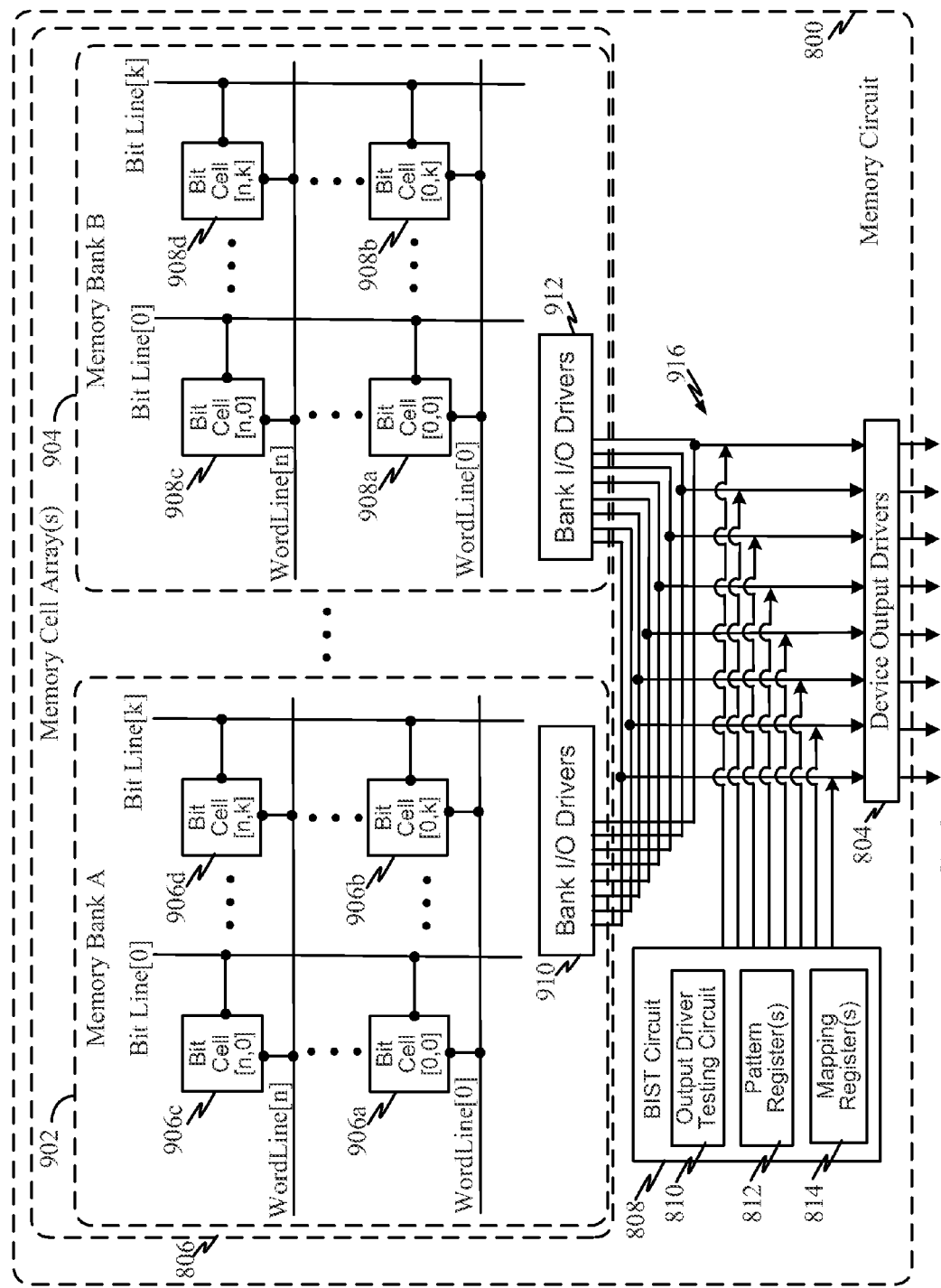
FIG. 9 illustrates an exemplary implementation of the memory cell arrays of FIG. 8 and a built-in self-test (BIST) circuit that uses a pattern register and mapping registers to test a plurality of output drivers.

FIG. 9 illustrates an exemplary implementation of the memory cell arrays of FIG. 8 and a built-in self-test (BIST) circuit that uses a pattern register and mapping registers to test a plurality of output drivers. In this example, the memory cell arrays 806 may include a plurality of memory banks 902 and 904. Each memory bank 902 and 904 may include a plurality of bit cells 906 and 908 coupled to input/output drivers 910 and 912. The input/output drivers 910 and 912 may be coupled to device output drivers 804 via an output bus 916. The BIST circuit 808, comprising the output driver testing circuit 810, pattern register(s) 812, and/or mapping register(s) 814, may be coupled to the output bus 816 between the input/output drivers 910, 912 and the device output drivers 804.

Figure 10:
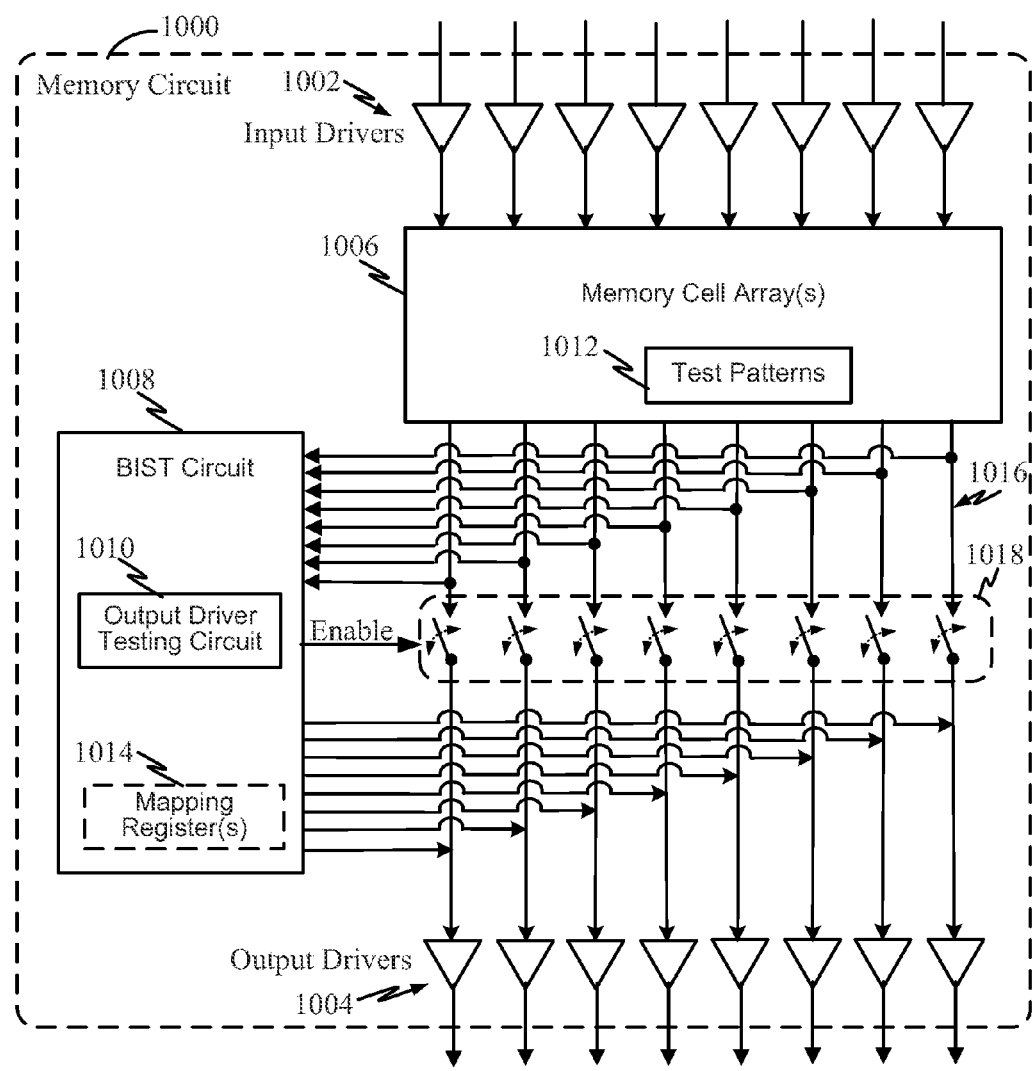
FIG. 10 illustrates a block diagram of a first alternative memory circuit including a built-in self-test (BIST) circuit that uses one or more test patterns loaded in the memory circuit to test a plurality of output drivers.

FIG. 10 illustrates a block diagram of a first alternative memory circuit including a built-in self-test (BIST) circuit that uses one or more test patterns loaded in the memory circuit to test a plurality of output drivers. The memory circuit 1000 may include a plurality of input drivers 1002 coupled to a plurality of memory cell arrays 1006. A plurality of output drivers 1004 may be selectively coupled to the plurality of memory cell arrays 1006. In one example, the output drivers 1004 may generate or output multi-level signals having more levels than a binary signal (e.g., more than two states or levels). For instance, such multi-level signal may be a tri-level or tri-state signal, quad-level or quad-state signal, or n-level or n-state signal (where n>2). A BIST circuit 1008 includes an output driver testing circuit 1010. In this example, an output bus 1016 between the memory cell arrays 1006 and output drivers 1004 may include a switch 1018 that may be selectively switched so that output from the memory cell arrays 1006 goes either directly to the output drivers 1004 or through the BIST circuit 1008. In this example, the BIST circuit 1008 may enable or disable the switch 1018 to obtain (e.g., read) one or more test patterns 1012 stored in the memory cell arrays 1006 via output bus 1016. The output driver testing circuit 1010 may then use the obtained test pattern(s) 1012 to test the output driver performance. Once finished, the BIST circuit 1008 may enable or disable the switch 1018 to allow the memory cell arrays to send output directly to the output drivers 1004. Note that the test patterns 1012 may be loaded from an internal source or from an external source (e.g., loaded by an external loader). The test pattern 1012 may be removed or overwritten during normal operation of the memory circuit 1006. The test pattern 1012 may be removed or overwritten during normal operation of the memory circuit 1006. In one example, the test pattern(s) 1012 may be used directly as the output pattern or output value sent to the output drivers 1004 over the output bus 1016. Alternatively, one or more mapping registers 1014 may map the test pattern(s) 1012 to generate the output pattern or output value.

Figure 11:
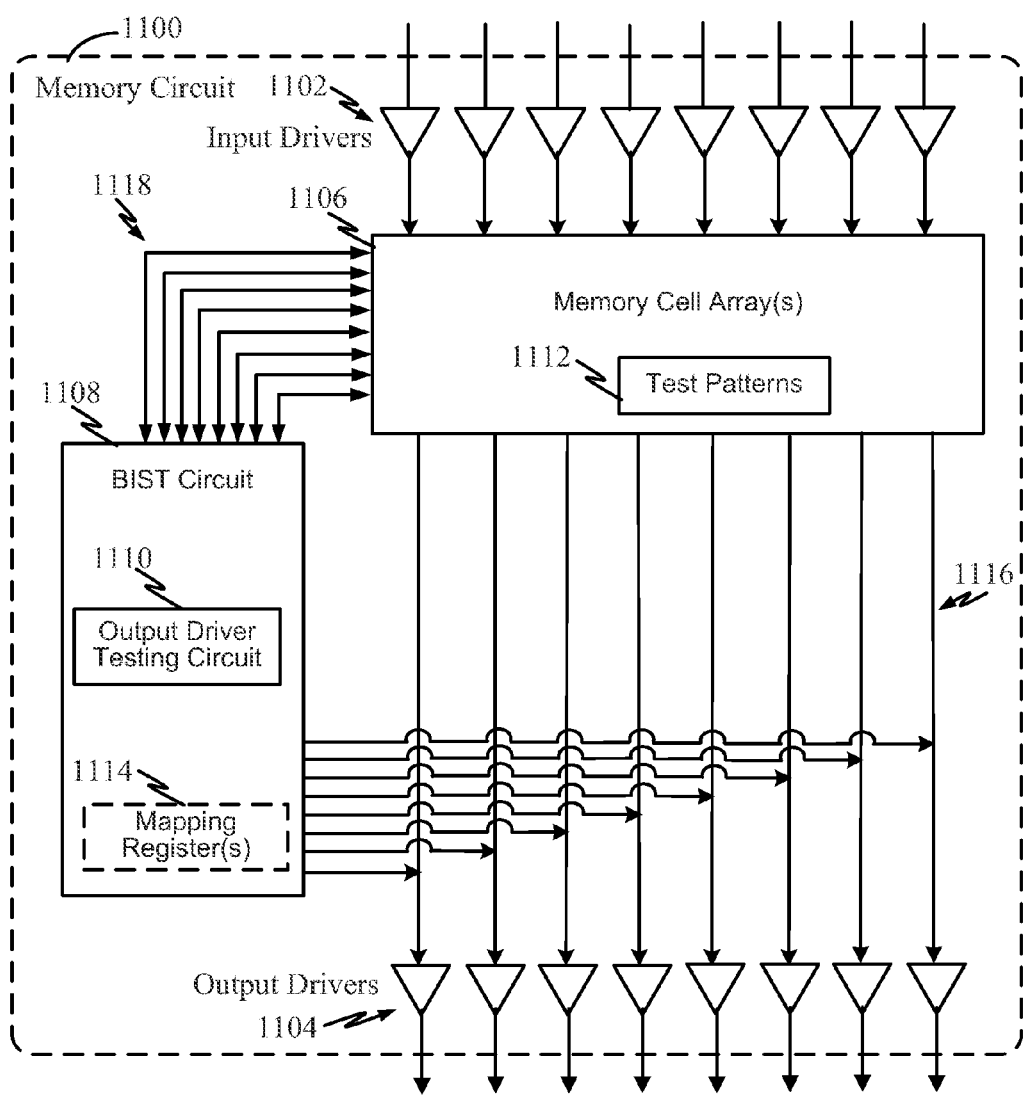
FIG. 11 illustrates a block diagram of a second alternative memory circuit including a built-in self-test (BIST) circuit that uses one or more test patterns loaded in a memory circuit/device to test a plurality of output drivers.

FIG. 11 illustrates a block diagram of a second alternative memory circuit including a built-in self-test (BIST) circuit that uses one or more test patterns loaded in a memory circuit/device to test a plurality of output drivers. The memory circuit 1100 may include a plurality of input drivers 1102 coupled to a plurality of memory cell arrays 1106. A plurality of output drivers 1104 may be selectively coupled to the plurality of memory cell arrays 1106. In one example, the output drivers 1104 may generate or output multi-level signals having more levels than a binary signal (e.g., more than two states or levels). For instance, such multi-level signal may be a tri-level or tri-state signal, quad-level or quad-state signal, or n-level or n-state signal (where n>2). A BIST circuit 1108 includes an output driver testing circuit 1110. In this example, an output bus 1116 extends between the memory cell arrays 1106 and output drivers 1104. In this example, a dedicated bus 1118 may extend between the BIST circuit 1108 and the memory cell arrays 1106 to allow the BIST circuit 1108 to obtain (e.g., read) one or more test patterns 1112 stored in the memory cell arrays 1106. The output driver testing circuit 1110 may then use the obtained test pattern(s) 1112 to test the output driver 1104 performance. Note that the test patterns 1112 may be loaded from an internal source or from an external source (e.g., loaded by an external loader). The test pattern 1112 may be removed or overwritten during normal operation of the memory cell arrays 1106. The test pattern 1112 may be removed or overwritten during normal operation of the memory circuit 1106. In one example, the test pattern(s) 1112 may be used directly as the output pattern or output value sent to the output drivers 1104 over the output bus 1116. Alternatively, one or more mapping registers 1114 may map the test pattern(s) 1112 to generate the output pattern or output value.

While the examples in FIGS. 8 and 9 may serve to characterize the output driver performance for a device, the examples in FIGS. 10 and 11 may serve to characterize data path performance. Additionally, the memory circuits of FIGS. 8, 9, 10, and 11 allow an external host system to access (e.g., write) the memory cell arrays 806, 1006, 1106 even while a BIST test operation is occurring. For instance, since the BIST test operation may be inserted directly onto the output data lines, the input drivers and the memory cell arrays may remain accessible by the external host system. In various examples, the BIST circuit 810, 1008, and 1108 may perform its input/output test operations independent of operations performed by a memory controller that writes or reads data from the memory cell array.

Figure 12:
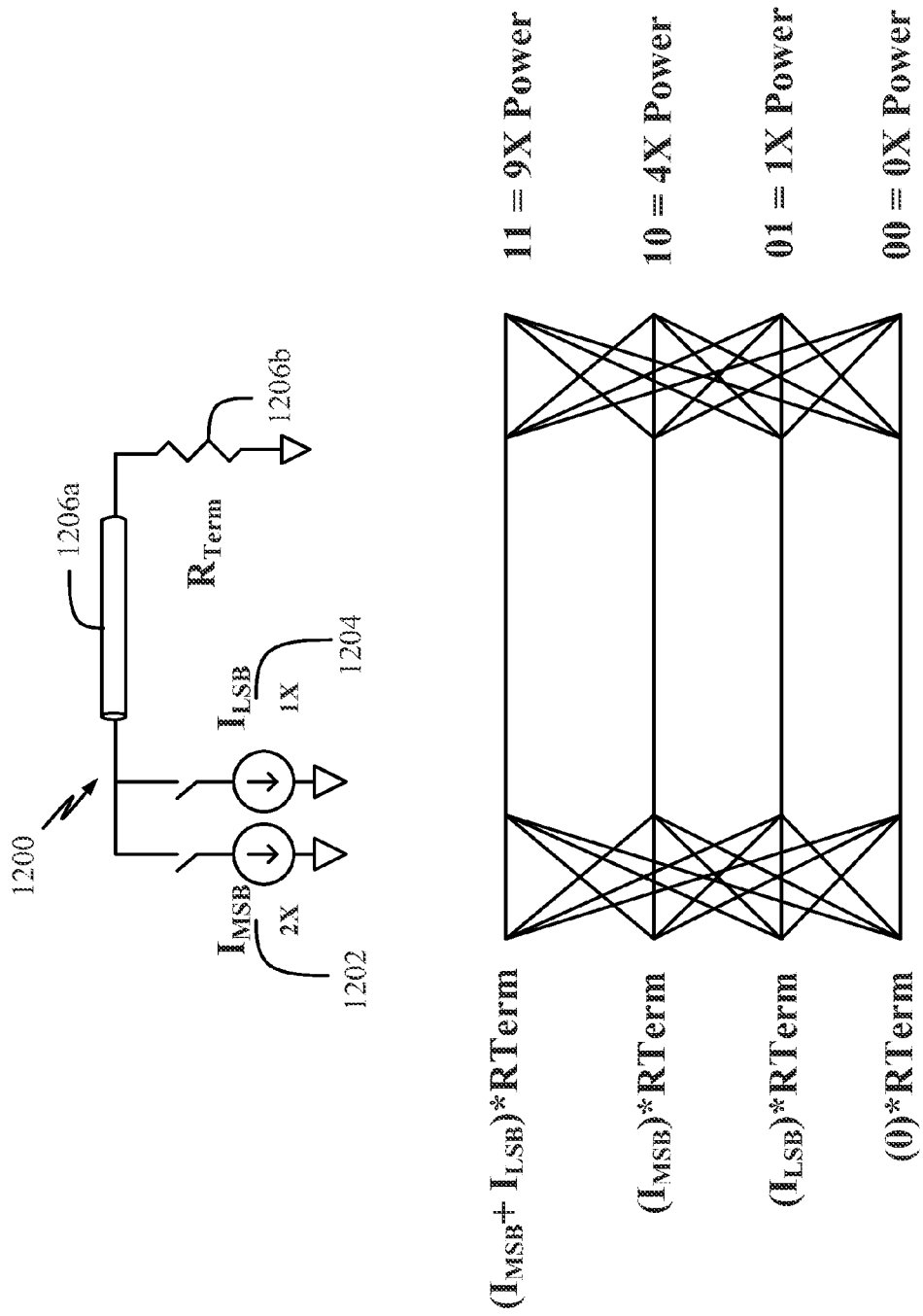
FIG. 12 illustrates a circuit wherein a terminated multi-level signal consumes distinct amounts of power at each signal level.

FIG. 12 illustrates a circuit 1200 wherein a terminated multi-level signal consumes distinct amounts of power at each signal level. FIG. 12 illustrates one implementation of a multi-level signal. Illustrated is an example 4-PAM, ground-terminated embodiment. In this example, the currents associated with the Most Significant Bit and the Least Significant Bit of the 2-bit data symbol are identified as the $I_{MSB}$ 1202, and the $I_{LSB}$ 1204. The $I_{MSB}$ 1202 and The $I_{LSB}$ 1204 are in parallel with a termination resistance 1206. In other words, the $I_{MSB}$ 1202 and the $I_{LSB}$ 1204 are summed across the termination resistance 1206 to produce the appropriate signal level. Power is consumed during non-zero states. Moreover, more power is consumed for higher signal levels. For example, referring to the bottom portion of FIG. 12, various power levels may be defined: two zeros (00) is lowest (0× power), two ones (11) is highest (9× power), with zero/one (01) being 1× power and one/zero (10) being 4× power. In other words, the $I_{MSB}$ 1202 is interpreted as a 2 times signal or 2× signal, while the $I_{LSB}$ 1204 is interpreted as a 1× or 1 times signal. Note, as is traditional, "I" represents electrical current, and "R" represents electrical resistance. The example above demonstrates a simple current-mode approach, in which the MSB data stream and the LSB data stream are used to trigger two distinct current sources. When the two currents are 1× and 2×, respectively, four equally spaced voltage levels may be generated across a termination resistance. Obviously, the spacing does not need to be uniform, and therefore the source currents could take on different levels. Additionally, other implementations use other circuits to affect a multi-level signal. In contrast to FIG. 12, the termination resistance can be connected to the positive power supply, thus reversing the power levels, the LSB stream can be routed to the larger source current, and vice versa, and the entire structure and/or functionality of FIG. 12 can be implemented using voltage mode techniques. The different levels relate to different outputs that can be used in built-in-self-tests to characterize I/O capabilities. The technique illustrated in FIG. 12 or other techniques to generate multi-level signals may be used to generate a multi-level signal from a plurality of register values for testing an input/output interface.

Exemplary Electronic Device

Figure 13:
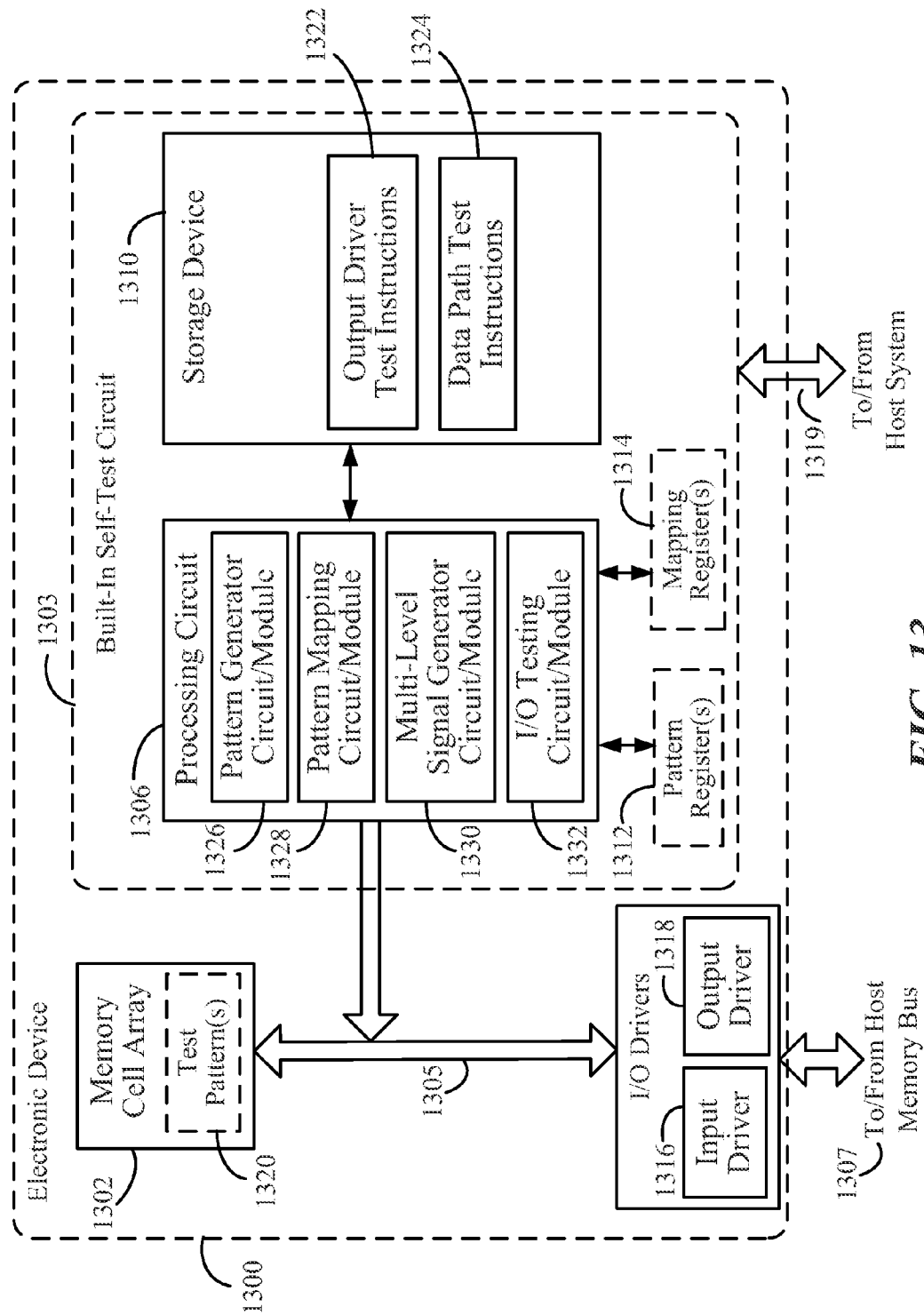
FIG. 13 illustrates an exemplary block diagram of a hardware implementation for a built-in self-test circuit within an electronic device that includes a memory cell array.

FIG. 13 illustrates an exemplary block diagram of a hardware implementation for a built-in self-test circuit 1303 within an electronic device 1300 that includes a memory cell array 1302. The electronic device 1300 may be a mobile phone, smartphone, tablet, portable computer, system-on-a-chip, multi-layer chip, memory module, memory chip, and or any other electronic device having circuitry. The electronic device 1300 may include the memory cell array 1302 coupled to an output/read data bus 1305, the built-in self-test circuit 1303 also coupled to the data bus 1305 and/or the memory cell array 1302, and/or I/O drivers comprising an input driver 1316 and output driver 1318 coupled to a host memory bus 1307. In one example, the output driver 1318 may be an off-chip driver, which provides data output off the chip or module on which the memory cell array resides. The output driver 1318 may be distinct from drivers located within memory cell arrays.

The built-in self-test circuit 1303 may include a processing circuit 1306, a storage device 1310, and/or one or more registers 1312 and 1314. The storage device 1310 may include output driver test instructions 1322 and data path test instructions 1324 that allow the processing circuit to characterize the output drive 1318 and/or the data path from the memory cell array 1302 to the host memory bus 1307, respectively.

The processing circuit 1306 may include a pattern generator circuit/module 1326 that serves to generate data patterns as described herein and can store the data patterns within pattern registers 1312. In some implementations, the pattern generator circuit/module 1326 may be adapted to dynamically generate a fixed or random pattern on boot-up of a host system or upon request from the BIST circuit 1303. Alternatively, in other implementations, the pattern register(s) 1312 may be pre-loaded with a pattern (e.g., read-only registers) and the pattern generator circuit/module 1326 may be omitted.

The processing circuit 1306 may also include a pattern mapping circuit/module 1328 that serves to map the data pattern from the pattern registers 1312. In some implementations, the pattern mapping circuit/module 1328 may be adapted to dynamically generate a fixed or random mapping pattern on boot-up of a host system or upon request from the BIST circuit 1303. Alternatively, in other implementations, the mapping register(s) 1312 may be pre-loaded with a mapping pattern (e.g., read-only registers) and the mapping generator circuit/module 1226 may be omitted. The mapping register(s) 1314 may serve to map a pattern (or part thereof) from the pattern register(s) 1312 to generate an output pattern or output value for a one or more data lines. Such output pattern or output value may be send sequentially or in parallel over the one or more data lines.

The processing circuit 1306 may also include a multi-level signal generator circuit/module 1330 that may generate multi-level signal using one or more outputs from the mapping registers. For instance, the multi-level signal generator circuit/module 1330 may generate a multi-level signal defined by at least three current or voltage levels or states. In one example, the multi-level signal may be generated using a plurality of outputs that are pulse-amplitude modulated, such that the generated multi-level signal defines: (a) a zero level when no output is received, (b) a first level when only the first output is received, (c) second level when only the second output is received, and (d) a third level when both the first and the second outputs are received, wherein the zero level, the first level, the second level, and the third level are all different voltage or current levels.

The processing circuit 1306 may also include an input/output testing circuit/module 1332 that may serve to at least partially characterize a performance of output drivers using the multi-level signal.

In some examples, the BIST circuit 1303 may be part of, or integrated with, a local memory controller (e.g., on the same chip) that controls operations of the memory cell array 1302 by controlling currents and voltages applied to individual memory cells, by reading and writing to the memory cells and, in general, managing the memory cells and all data flows into and out of the memory cell array 1302. The processing circuit 1306 may be programmable and may be configured to (e.g., programmed to) do the functions recited herein.

The processing circuit 1306 may execute one or more of a plurality of routines to read a pattern from a pattern register 1312 and then utilize the mapping registers 1314 to calculate one or more data patterns from a single pattern read. This one or more data patterns, wherein at least one data pattern is derived from the single pattern read or is an all zeros or all ones data pattern, is then sent to the output driver 1318.

Artificial intelligence based systems (e.g., explicitly and/or implicitly trained classifiers) can be employed in connection with performing inference and/or probabilistic determinations and/or statistical-based determinations as described herein. The built-in self-test circuit may employ various inference schemes and/or techniques in connection with the present approach. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic, that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines, etc.) can be employed in connection with performing automatic and/or inferred action in connection with the features described herein.

For example, the BIST storage component 1310 may include a specific BIST for a cold start on power up, another BIST for after a certain error condition, another BIST for after a different error condition, and many BISTs for many different temperature conditions. In addition, based upon measured current conditions and stored past prior conditions and past prior BIST results, the BIST circuit 1303 may make several inferences and select among the many currently available BISTs in an attempt to select an optimal BIST for that point in time, and in the current set of conditions (i.e., current environment, such as, for example, current temperature, time since boot up, results of last BIST, and the like).

An input interface 1319 may also be coupled to the processing circuit 1306 to provide inputs to the processing circuit 1306 from a host system. Many of the components illustrated in FIG. 13, if not all, may be a combination of software and hardware.

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable storage medium within memory cell array 1202, processing circuit 1206, and/or BIST storage device 1210. The computer-readable storage medium may be a non-transitory computer-readable storage medium. A non-transitory computer-readable storage medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable storage medium may also include, by way of example, a carrier wave, a transmission line, and any other suitable medium for transmitting software and/or instructions that may be accessed and read by a computer. The computer-readable storage medium may be embodied in a computer program product.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines, and/or devices.

Herein described are apparatuses and methods for storing a single data pattern in a pattern register physically located very close to a data line (e.g. a write data line), wherein the data pattern is read and a second data pattern is generated (e.g., derived from the read data pattern or not), and then the two data patterns are sent to an output driver for multi-level I/O testing of I/O capabilities of a memory array. Because the data pattern is not contained in memory of the memory array, all of the memory of the memory array is available for normal use. Additionally, the speed of accessing the pattern register physically located close to the data line is much faster than the speed of accessing a data pattern in the memory of the memory array, and therefore, a more accurate multi-level I/O testing is hereby achieved in comparison when the data pattern is stored in the memory of the memory array. Additionally, higher I/O speeds may be tested than heretofore. Because heretofore the speed of accessing the data pattern stored in the memory of the memory array was a limiting factor in performing a multi-level I/O testing such as a BIST. However, now with the herein described methods and apparatus, that limiting factor is eliminated. Additionally, the data pattern is coming from the memory side, as opposed to from the bus side, which further facilitates high-speed multi-level I/O testing.

Regardless of how the distinct pairs of data patterns are generated, the data pattern register, the output driver, and the circuitry generating the pairs of data patterns are all on the memory side of a memory device (e.g., within a chip or module, as opposed to the other side of the host bus. This proximity facilitates a relatively quick reading of the data pattern register, a relatively quick generation of the second pattern to form a pair, and/or a relatively quick bit shifting, or other convolution of the original pattern to generate a derived pattern, and lastly, a relatively quick providing of the pair of data patterns to the multi-level output driver. Collectively, all these improvements in process speed provide for performing multi-level I/O testing that is quicker, more responsive at higher speeds than other methods in which test patterns are either stored in the memory of the memory array or on the bus side of the memory device. Additionally, by not using the memory cells of the memory device, the memory cell array remains fully functional with the present approach, as opposed to traditional BIST approaches that consume memory making an access to memory unavailable to normal processes.

Figure 14:
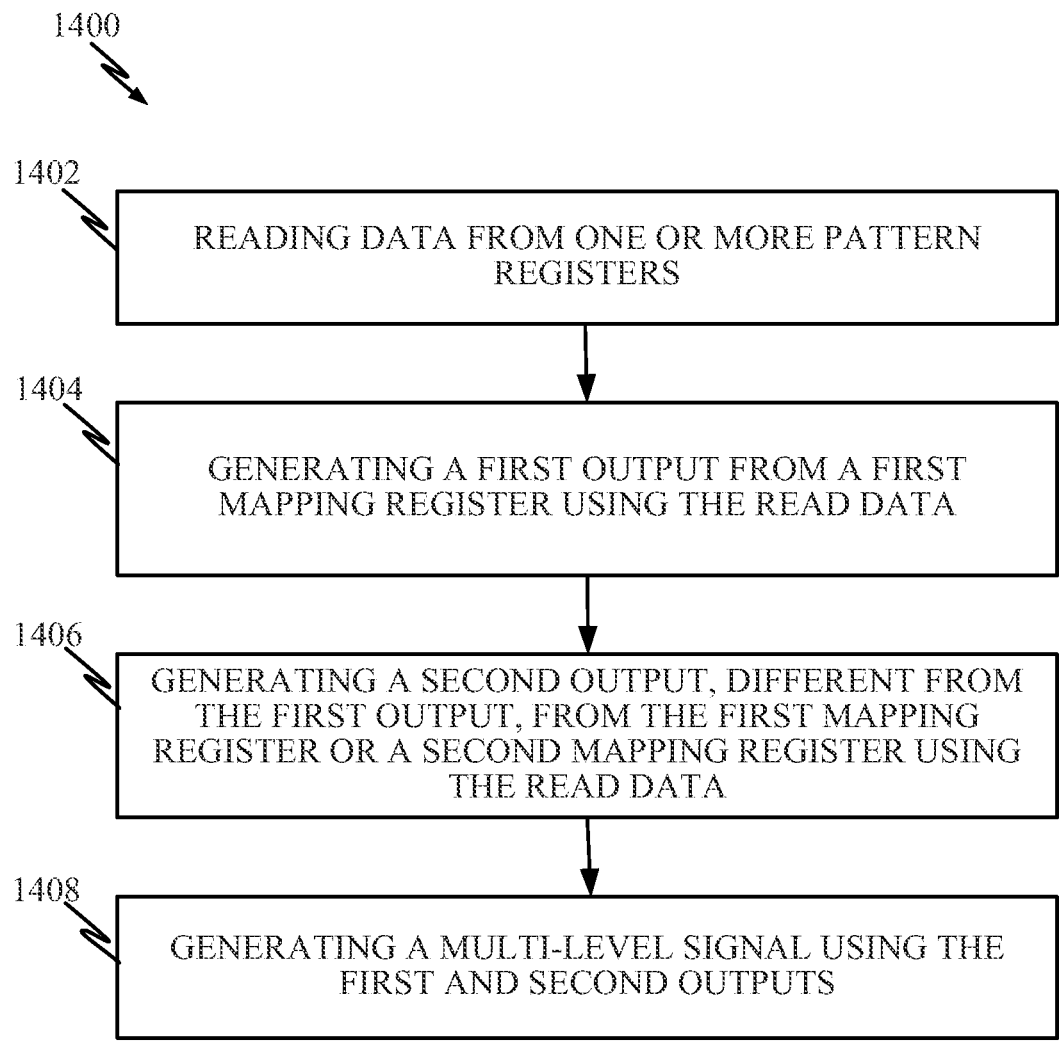
FIG. 14 illustrates a method for generating a pattern for a multi-level signal from a single data pattern.

Exemplary Data Pattern Generation for I/O Testing of Multilevel Interfaces Methods FIG. 14 illustrates a method 1400 for generating a pattern for a multi-level signal from a single data pattern. Data may be read from one or more pattern registers at step 1402. The pattern register may be hard coded and/or not writable or it may be writable wherein a single data pattern is written to it. When it is desirable to perform a multi-level I/O testing, either user initiated or software initiated based upon certain events happening or in accordance with the BIST 1303 in FIG. 13, at step 1404, a first output is generated from a first mapping register using the read data. At step 1406, a second output is generated, different from the first output, from the first mapping register or a second mapping register using the read data. In other words, two outputs are generated, which are different from each other and both outputs are generated from the same or distinct mappings of the read data. For instance, when the same mapping register is used to generate the first and second outputs, different pattern registers may be used. Alternatively, when the same pattern register is used to generate the first and second outputs, different mapping registers may be used. At step 1408, a multi-level signal is generated using the first and second outputs. The multilevel signal may be part of a BIST operation. In one example, the multi-level signal may be generated by mapping or converting at least part of the first output to a first signal level (e.g., a first current or voltage level), mapping or converting at least part of the second output to a second signal level (e.g., a second current or voltage level), and/or mapping or converting at least part of the first output and second output to a third signal level (e.g., a third current or voltage level).

According to one aspect, the method described in FIG. 14 may serve to generate quad-state multi-level signals (e.g., four level signal illustrated in FIG. 12). However, this concept may be expanded to even greater states/level by using more mapping registers to generate a greater number of outputs and/or by combining the different available outputs in different ways.

Figure 15:
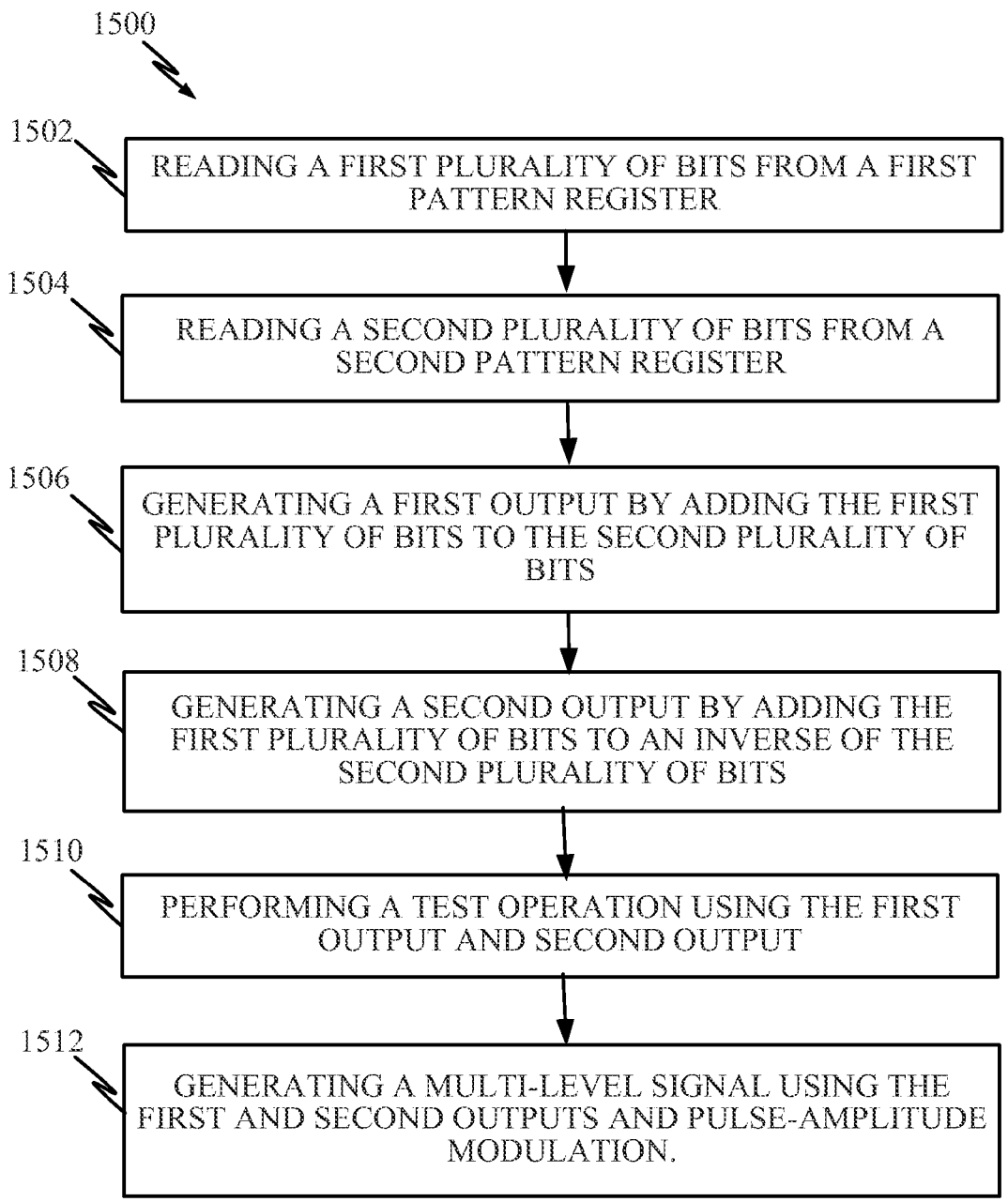
FIG. 15 illustrates another method for generating a pattern for a multi-level signal from a plurality of data patterns.

FIG. 15 illustrates another method 1500 for generating a pattern for a multi-level signal from a plurality of data patterns. A first plurality of bits is read from a first pattern register at step 1502. A second plurality of bits is read from a second pattern register at step 1504. A first output may be generated by adding the first plurality of bits to the second plurality of bits at step 1506. A second output may be generated by adding the first plurality of bits to an inverse of the second plurality of bits at step 1508. Step 1510, a test operation is performed by using the first output and the second output. For instance, at step 1512, a multi-level signal is generated by using the first and second outputs and a pulse-amplitude modulation. Such multi-level signal may be used in the test operation. In one example, the generated multi-level signal may be defined as: zero level=receiving no output, first level=receiving only the first output, second level=receiving only the second output, and third level=receiving both the first and second outputs (combined), wherein the zero level, the first level, the second level, and the third level are all different voltage and/or current levels.

Figure 16:
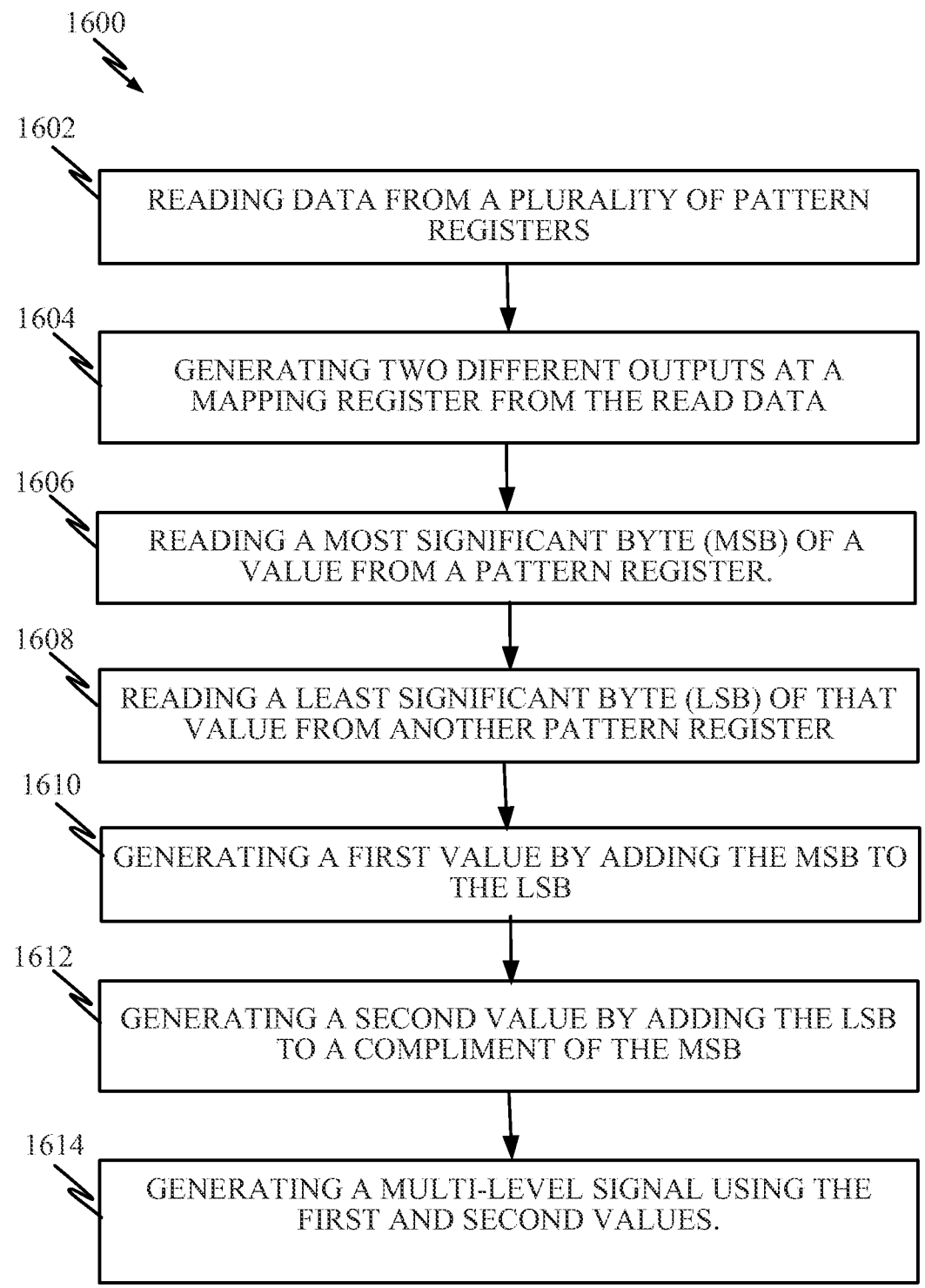
FIG. 16 illustrates another method for generating a multi-level signal using a plurality of data patterns.

FIG. 16 illustrates another method 1600 for generating a multi-level signal using a plurality of data patterns. Data may be read from a plurality of pattern registers, at step 1602, and two different outputs may be generated at a mapping register from the read data, at step 1604. A most significant byte (MSB) of a value is read from one pattern register, at step 1606. Similarly, a least significant byte (LSB) of that same value is read from another pattern register, at step 1608. At step 1610, a first value is generated by adding the MSB to the LSB. Likewise, at step 1612, a second value may be generated by adding the MSB to a complement of the LSB (or alternatively adding the LSB to a complement of the MSB). A multi-level signal may be generate using the first and second values, at step 1614.

One or more of the components, steps, features, and/or functions illustrated in the Figures may be rearranged and/or combined into a single component, step, feature, or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

In addition, it is noted that the embodiments may be described as a process that is depicted as a flowchart, a flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices, and/or other machine-readable mediums for storing information. The term "machine readable medium" includes, but is not limited to portable or fixed storage devices, optical storage devices, wireless channels and various other mediums capable of storing, containing, or carrying instruction(s) and/or data.

Furthermore, embodiments may be implemented by hardware, software, firmware, middleware, microcode, or any combination thereof. When implemented in software, firmware, middleware, or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor may read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features described herein may be implemented in different systems without departing from the described approaches. It should be noted that the foregoing embodiments are merely examples and are not to be construed as limiting. The description of the embodiments is intended to be illustrative, and not to limit the scope of the claims. As such, the present teachings may be readily applied to other types of apparatuses and many alternatives, modifications, and variations will be apparent to those skilled in the art.

What is claimed is:

1. A method of operating a device, comprising:
    reading data from one or more pattern registers of the device via a built-in test circuit;
    generating, via the built-in test circuit, a first output from a first mapping register using the read data;
    generating, via the built-in test circuit, a second output, different from the first output, from the first mapping register or a second mapping register using the read data; and
    generating a multi-level signal in the built-in test circuit using the first and second outputs.

2. The method of claim 1, wherein reading data comprises:
    reading a first plurality of bits from a first pattern register; and
    reading a second plurality of bits from a second pattern register, and wherein generating the first and second outputs comprises:
        generating the first output by adding the first plurality of bits to the second plurality of bits; and
        generating the second output by adding the first plurality of bits to an inverse of the second plurality of bits.

3. The method of claim 1, wherein the first output is generated using a first pattern register and the first mapping register, and the second output is generated using the first pattern register and the second mapping register.

4. The method of claim 1, wherein the first output is generated using a first pattern register and the first mapping register, and the second output is generated using a second pattern register and the first mapping register.

5. The method of claim 1, wherein the one or more pattern registers are within a memory circuit and coupled to output drivers for the memory circuit, and data patterns are stored in the one or more pattern registers.

6. The method of claim 5, wherein the multi-level signal is inserted into data lines extending between a memory cell array and the plurality of output drivers for the memory circuit.

7. The method of claim 1, wherein reading data comprises:
    reading a first plurality of bits from a first pattern register; and
    reading a second plurality of bits from a second pattern register.

8. The method of claim 7, wherein generating the first output and second output comprises:
    generating the first output by adding the first plurality of bits to the second plurality of bits;
    shifting the second plurality of bits at least one place with a linear-feedback-shift-register to create a modified second plurality of bits; and
    generating the second output by adding the first plurality of bits to the modified second plurality of bits.

9. The method of claim 7, wherein the first pattern register is a read-only register and the first plurality of bits are pre-stored in the first pattern register.

10. The method of claim 1, further comprising:
    performing an input/output test operation using the first and second outputs.

11. The method of claim 10, wherein the input/output (I/O) test operation serves to at least partially characterize a performance of output drivers using the multi-level signal.

12. The method of claim 1, wherein the multi-level signal defines at least three current or voltage levels or states.

13. The method of claim 1, wherein the generating a multi-level signal using the first and second outputs comprises:
    generating the multi-level signal using the first and second outputs using pulse-amplitude modulation, such the generated multi-level signal defines:
        a zero level when no output is received;
        a first level when only the first output is received;
        second level when only the second output is received; and
        a third level when both the first and the second outputs are received, wherein the zero level, the first level, the second level, and the third level are all different voltage or current levels.

14. A device comprising:
    a memory cell array;
    a plurality of output drivers coupled to the memory cell array via a plurality of data lines; and
    a built-in self-test circuit operationally coupled to the plurality of data lines, the built-in self-test circuit configured to:
        read data from one or more pattern registers;
        generate a first output from a first mapping register using the read data;
        generate a second output, different from the first output, from the first mapping register or a second mapping register using the read data; and
        generate a multi-level signal using the first and second outputs.

15. The device of claim 14, wherein the built-in self-test circuit is further configured to:
 read a first plurality of bits from a first pattern register; and
 read a second plurality of bits from a second pattern register, and wherein generating the first and second outputs comprises:
  generate the first output by adding the first plurality of bits to the second plurality of bits; and
  generate the second output by adding the first plurality of bits to an inverse of the second plurality of bits.

16. The device of claim 14, wherein the first output is generated using a first pattern register and the first mapping register, and the second output is generated using the first pattern register and the second mapping register.

17. The device of claim 14, wherein the first output is generated using a first pattern register and the first mapping register, and the second output is generated using a second pattern register and the first mapping register.

18. The device of claim 14, wherein the one or more pattern registers are within a memory circuit that also includes the memory cell array and the plurality of output drivers, the one or more pattern registers are couple to the output drivers and data patterns are stored in the one or more pattern registers.

19. The device of claim 18, wherein the multi-level signal is inserted into data lines extending between the memory cell array and the plurality of output drivers.

20. The device of claim 14, wherein reading data from one or more pattern registers comprises:
 reading a first plurality of bits from a first pattern register; and
 reading a second plurality of bits from a second pattern register.

21. The device of claim 14, wherein the first pattern register is a read-only register and the first plurality of bits are pre-stored in the first pattern register.

22. The device of claim 14, wherein the built-in self-test circuit is further configured to:
 perform an input/output test operation using the first and second outputs.

23. The device of claim 22, wherein the input/output (I/O) test operation serves to at least partially characterize a performance of the output drivers using the multi-level signal.

24. The device of claim 14, wherein the multi-level signal defines at least three current or voltage levels or states.

25. The device of claim 14, wherein the built-in self-test circuit is further configured to: generate the multi-level signal using the first and second outputs using pulse-amplitude modulation, such the generated multi-level signal defines:
 a zero level when no output is received;
 a first level when only the first output is received;
 second level when only the second output is received; and
 a third level when both the first and the second outputs are received, wherein the zero level, the first level, the second level, and the third level are all different voltage or current levels.

26. A memory circuit, comprising:
 means for reading data from one or more pattern registers;
 means for generating a first output from a first mapping register using the read data;
 means for generating a second output, different from the first output, from the first mapping register or a second mapping register using the read data; and
 means for generating a multi-level signal using the first and second outputs.

27. The memory circuit of claim 26, wherein the first output is generated using a first pattern register and the first mapping register, and the second output is generated using the first pattern register and the second mapping register.

28. The memory circuit of claim 26, wherein the first output is generated using a first pattern register and the first mapping register, and the second output is generated using a second pattern register and the first mapping register.

29. The memory circuit of claim 26, further comprising:
 means for performing an input/output test operation using the first and second outputs, wherein the input/output (I/O) test operation serves to at least partially characterize a performance of output drivers using the multi-level signal.

30. A non-transitory machine-readable storage medium, having instructions stored thereon which when executed by at least one processor causes the at least one processor to:
 read data from one or more pattern registers;
 generate a first output from a first mapping register using the read data;
 generate a second output, different from the first output, from the first mapping register or a second mapping register using the read data; and
 generate a multi-level signal using the first and second outputs.

* * * * *